United States Patent
Liang et al.

(10) Patent No.: US 11,682,619 B2
(45) Date of Patent: Jun. 20, 2023

(54) PACKAGE COMPONENT, SEMICONDUCTOR PACKAGE AND MANUFACTURING METHOD THEREOF

(71) Applicant: Taiwan Semiconductor Manufacturing Company, Ltd., Hsinchu (TW)

(72) Inventors: Fang-Yu Liang, Taipei (TW); Kai-Chiang Wu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/718,260

(22) Filed: Apr. 11, 2022

(65) Prior Publication Data

US 2022/0246521 A1 Aug. 4, 2022

Related U.S. Application Data

(63) Continuation of application No. 16/915,964, filed on Jun. 29, 2020, now Pat. No. 11,309,242.

(51) Int. Cl.
| | |
|---|---|
| *H01L 23/522* | (2006.01) |
| *H01L 23/532* | (2006.01) |
| *H01L 23/528* | (2006.01) |
| *H01L 21/56* | (2006.01) |
| *H01L 21/768* | (2006.01) |
| *H01L 23/31* | (2006.01) |

(52) U.S. Cl.
CPC ........ *H01L 23/5226* (2013.01); *H01L 21/566* (2013.01); *H01L 21/76805* (2013.01); *H01L 23/3142* (2013.01); *H01L 23/5283* (2013.01); *H01L 23/53295* (2013.01)

(58) Field of Classification Search
CPC ............. H01L 23/5226; H01L 23/3142; H01L 23/5283; H01L 23/53295; H01L 21/566; H01L 21/76805
USPC ........................................................ 257/774
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |

(Continued)

*Primary Examiner* — Tu-Tu V Ho
(74) *Attorney, Agent, or Firm* — JCIPRNET

(57) ABSTRACT

A package component, a semiconductor package and a manufacturing method thereof are provided. The package component for electrically coupling a semiconductor die includes a functional circuit structure and a seal ring structure embedded in an insulating layer. The semiconductor die disposed on the package component is electrically coupled to the functional circuit structure. The seal ring structure is electrically isolated from the functional circuit structure, the seal ring structure includes a stack of alternating interconnect layers and via patterns, the via pattern at each level of the stack includes first features spaced apart from one another and arranged at neighboring corners of the insulating layer, and the first features are offset lengthwise relative to each other to overlap therewith, and the first features are spaced apart widthwise relative to each other.

20 Claims, 18 Drawing Sheets

(56) References Cited

U.S. PATENT DOCUMENTS

| | | |
|---|---|---|
| 9,496,189 B2 | 11/2016 | Yu et al. |
| 9,666,502 B2 | 5/2017 | Chen et al. |
| 9,735,131 B2 | 8/2017 | Su et al. |
| 11,088,069 B2 * | 8/2021 | Hou .................... H01L 23/5283 |

* cited by examiner

US 11,682,619 B2

PACKAGE COMPONENT, SEMICONDUCTOR PACKAGE AND MANUFACTURING METHOD THEREOF

CROSS-REFERENCE TO RELATED APPLICATION

This application is a continuation application of and claims the priority benefit of a prior application Ser. No. 16/915,964, filed on Jun. 29, 2020. The entirety of each of the above-mentioned patent application is hereby incorporated by reference herein and made a part of this specification.

BACKGROUND

With the advancement of modem technologies, integrated circuits having more functions and greater performance are increasingly demanded. In the packaging of integrated circuits, semiconductor dies are packaged onto package components, which include the circuitry used to route electrical signals. The package components may use organic materials such as materials that can be easily laminated. However, the materials are prone to the warpage caused by the elevated temperatures during a reflow process. Due to the warpage in the package components, crack or delamination may occur, and the yield of the packaging process is adversely affected. Therefore, there is the need for more creative packaging techniques.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
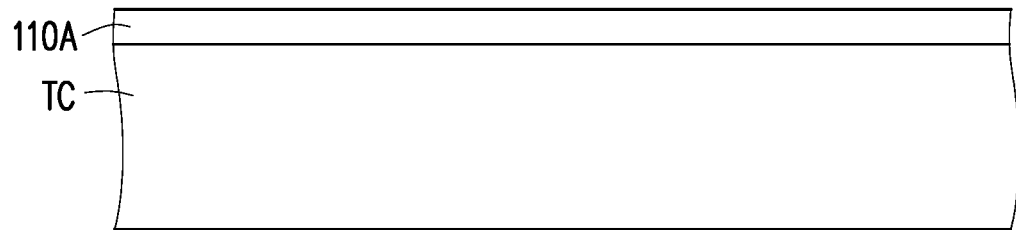
FIGS. 1A-1J are schematic cross-sectional views of various stages of manufacturing a semiconductor package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments of the present disclosure are discussed in the context of semiconductor manufacturing, and in particular, in the context of forming a semiconductor package including a package component having a seal ring structure. The seal ring structure surrounds the functional circuit structure and includes via features arranged in a discontinuous manner. In this manner, the package component may achieve high connection reliability without generating void and/or crack therein. Some variations of embodiments are discussed and the intermediate stages of forming the semiconductor package are illustrated in accordance with some embodiments. It should be appreciated that the illustration throughout the drawings are schematic and not in scale.

Figure 1B:
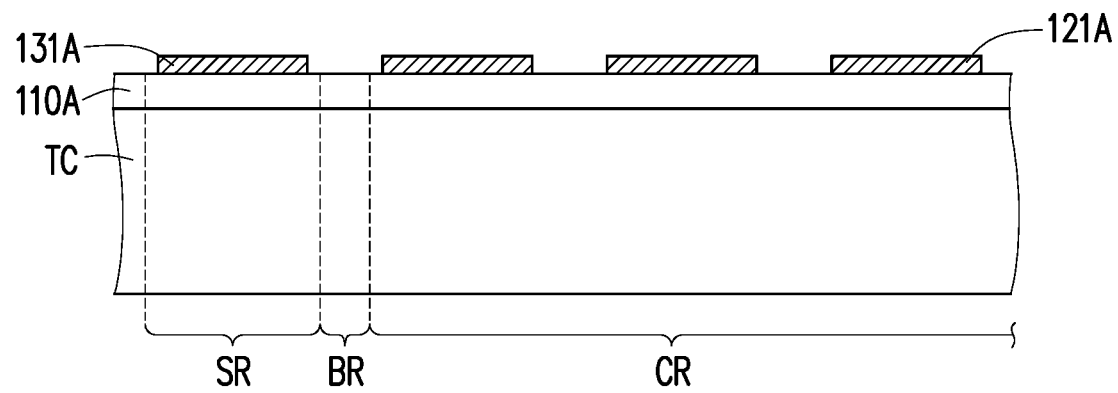
Figure 1C:
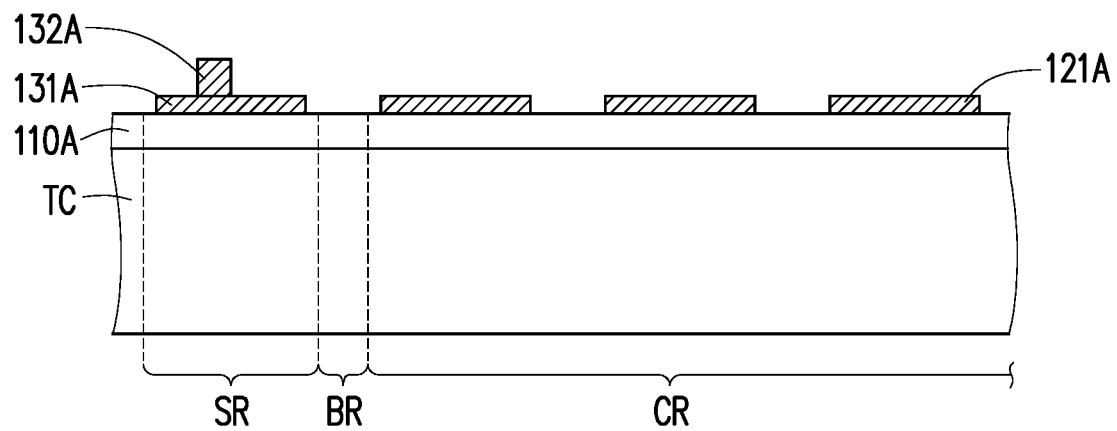
Figure 1D:
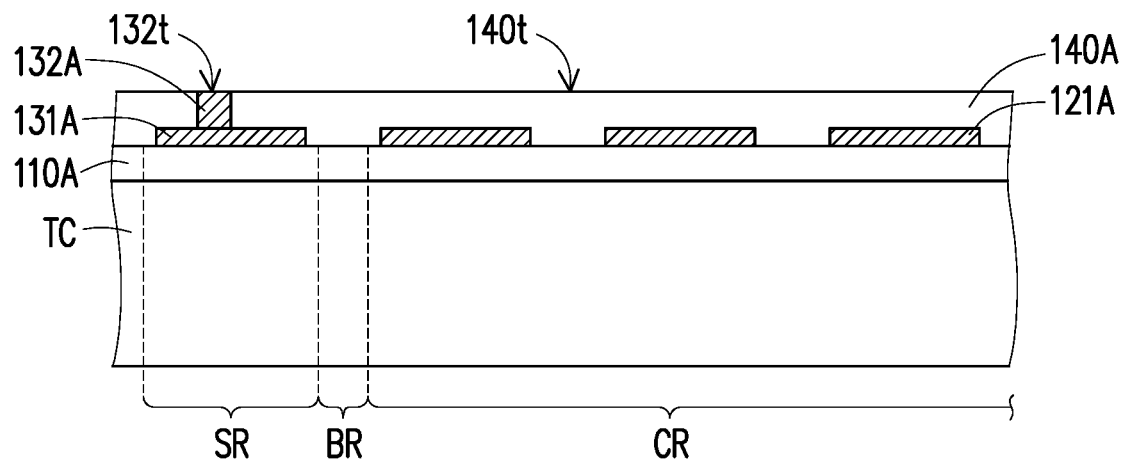
Figure 1E:
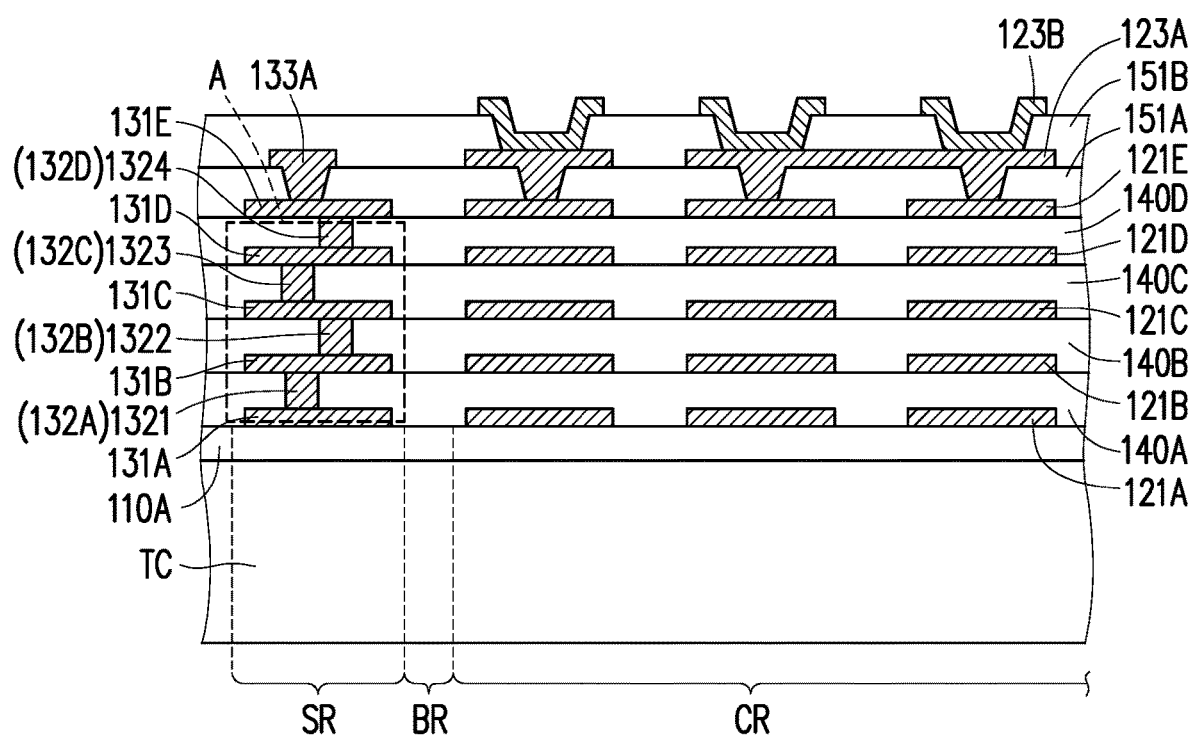
Figure 1F:
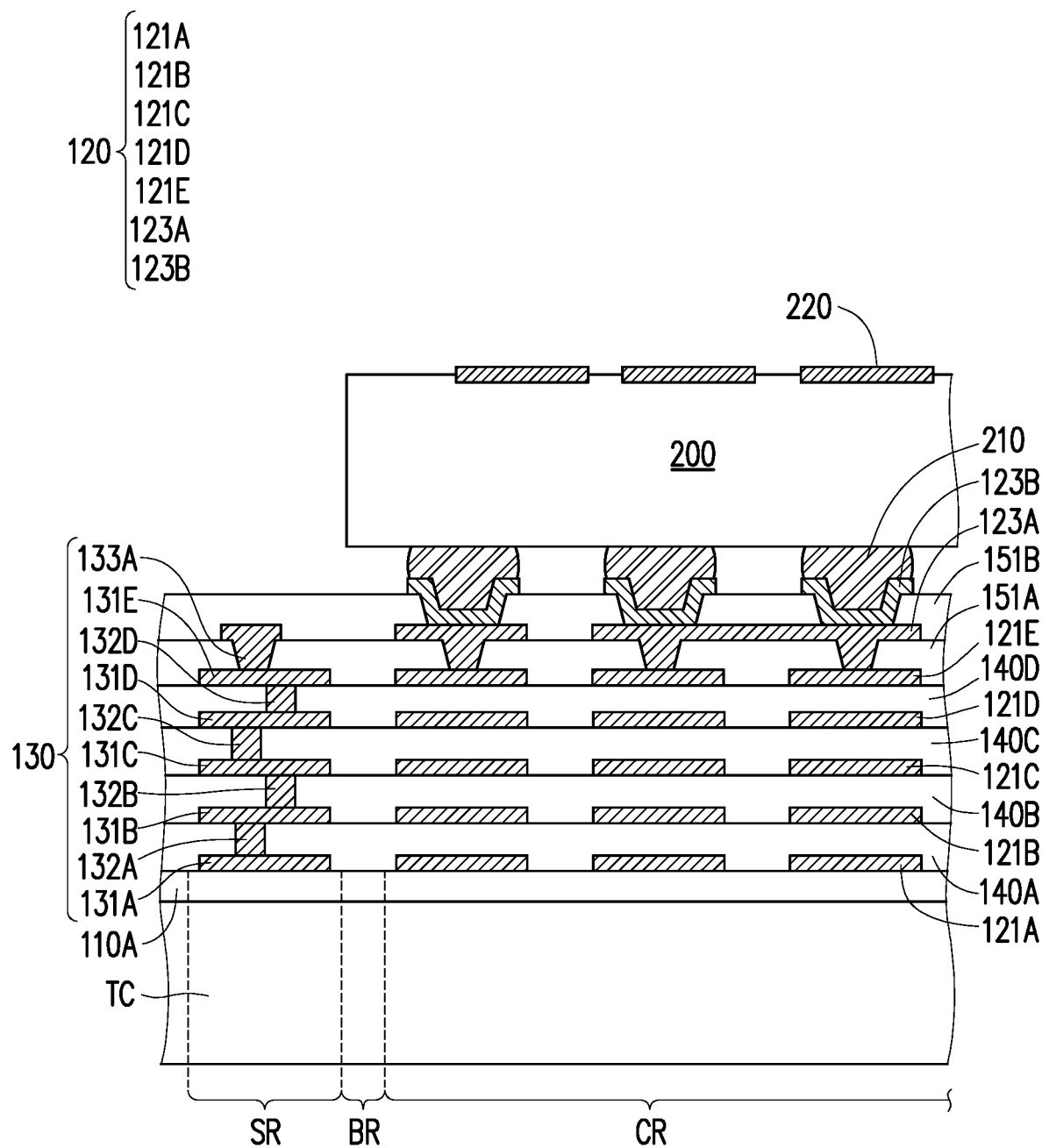
Figure 1G:
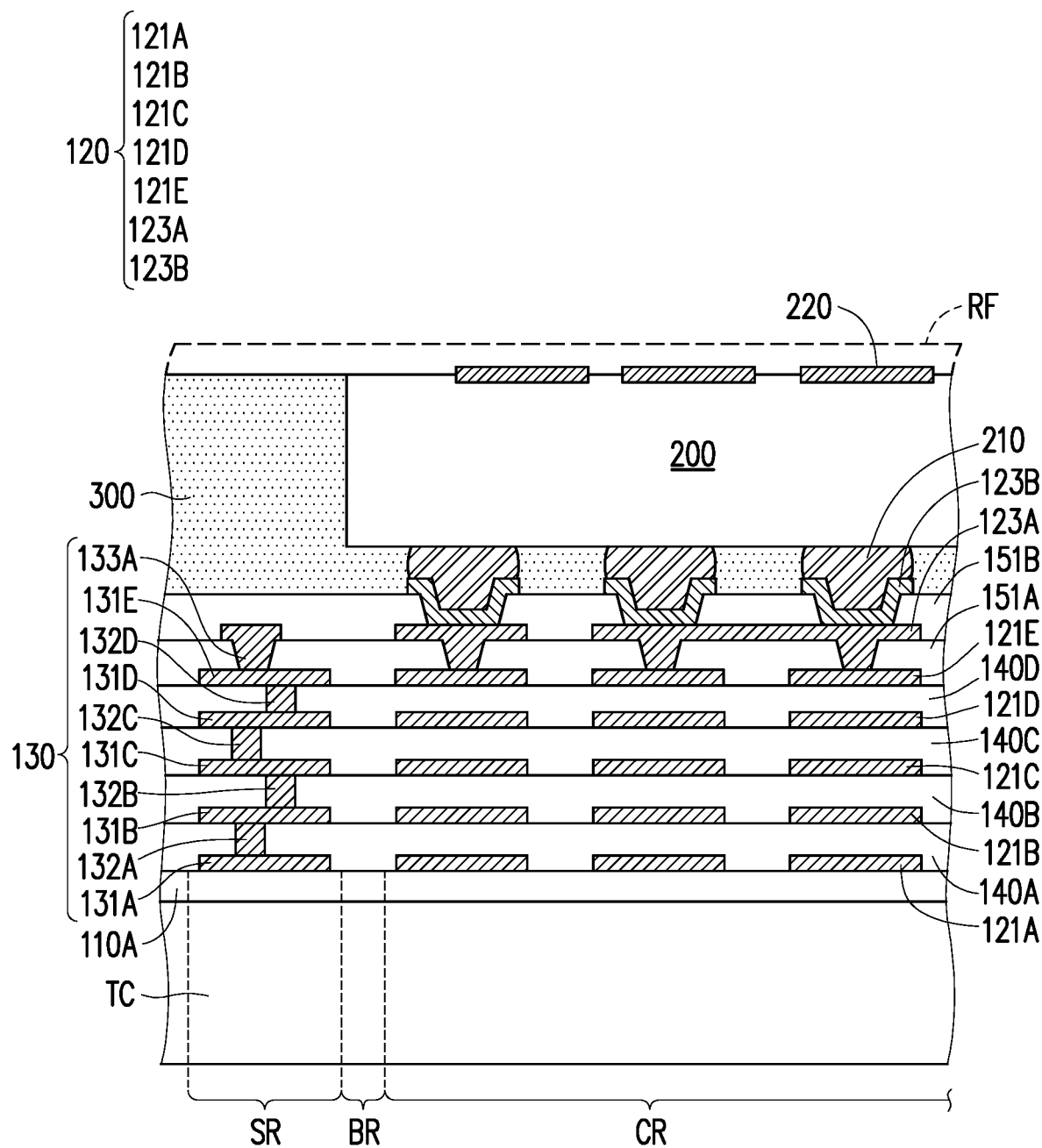
Figure 1H:
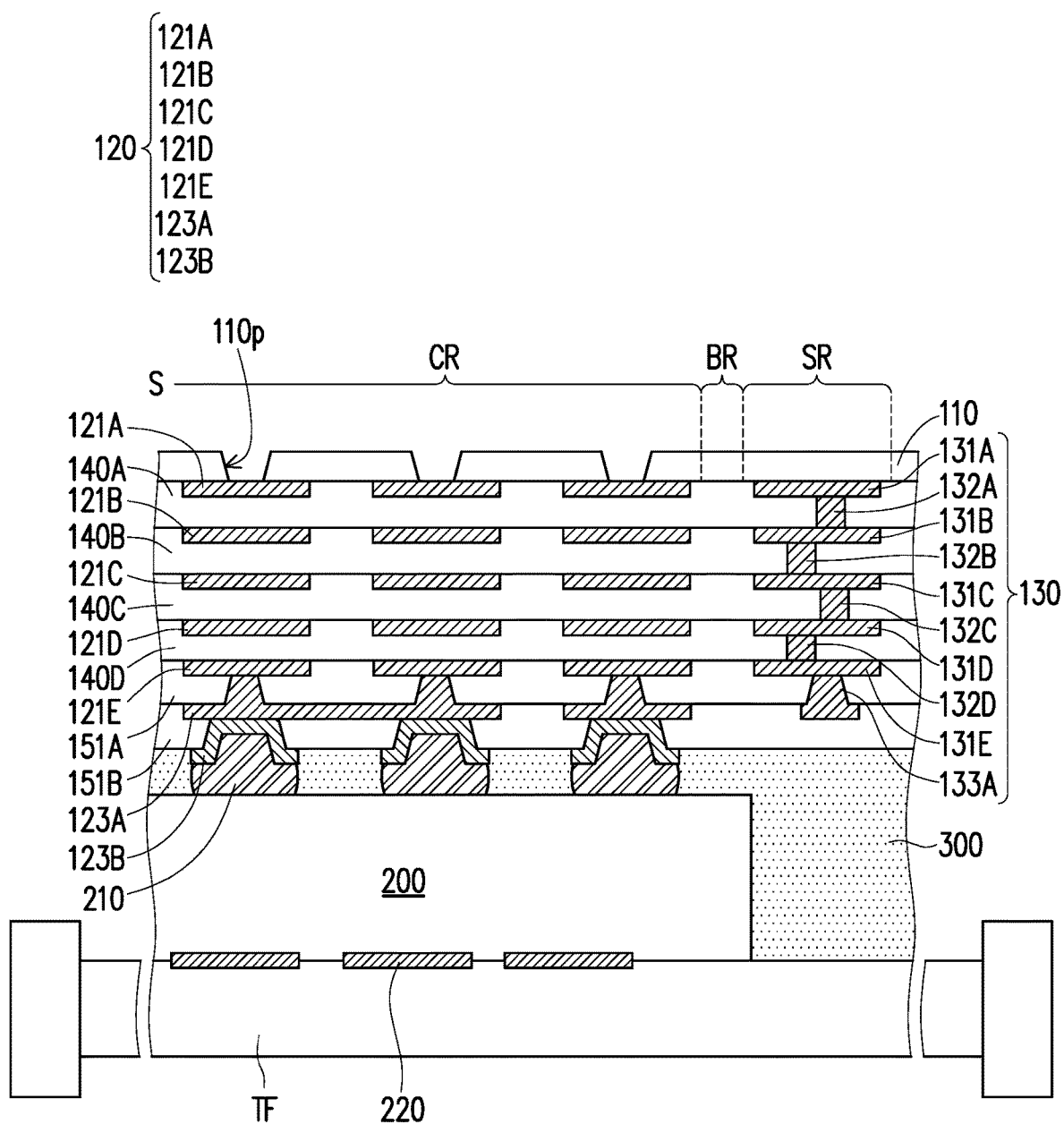
Figure 1I:
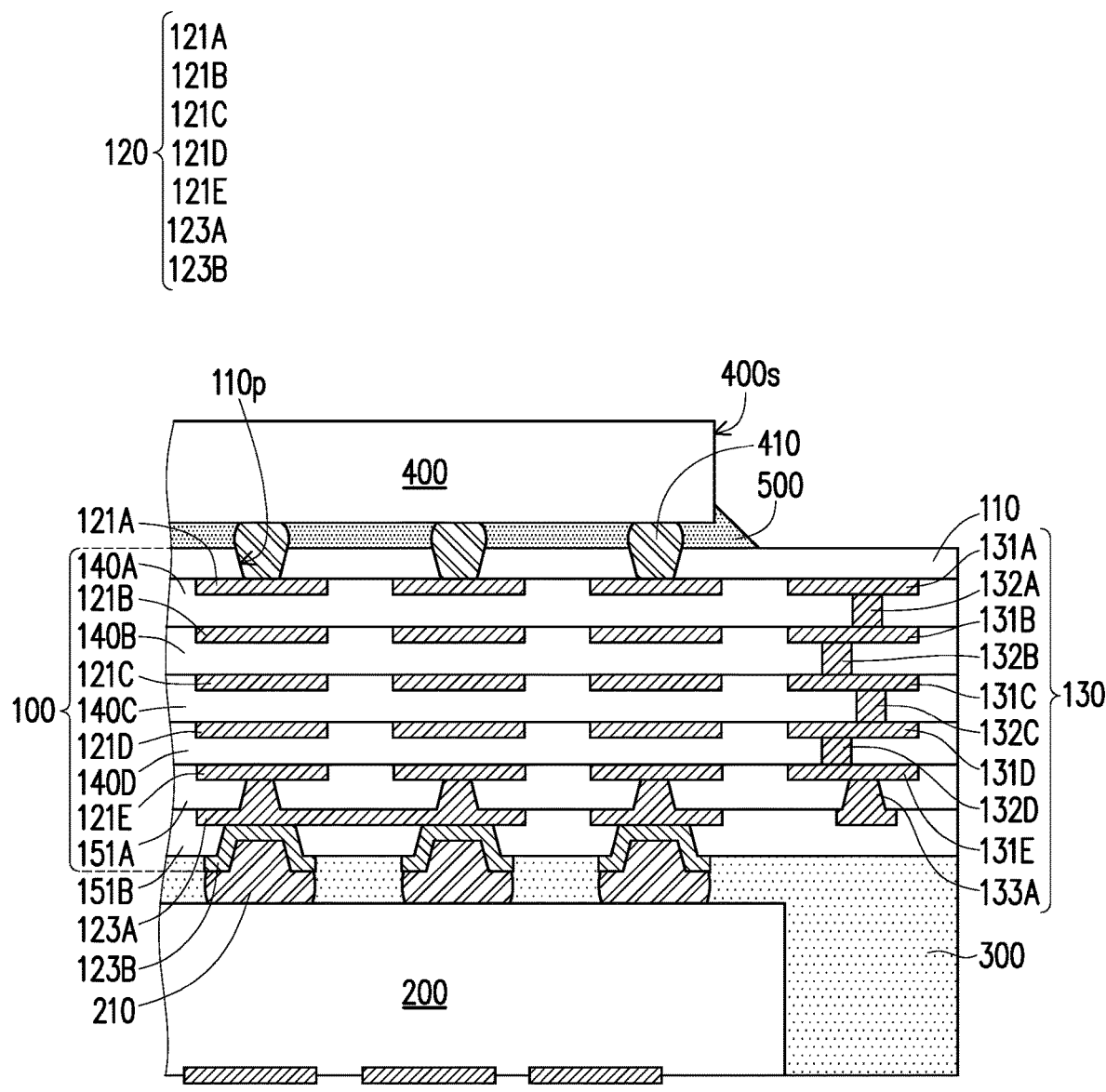
Figure 1J:
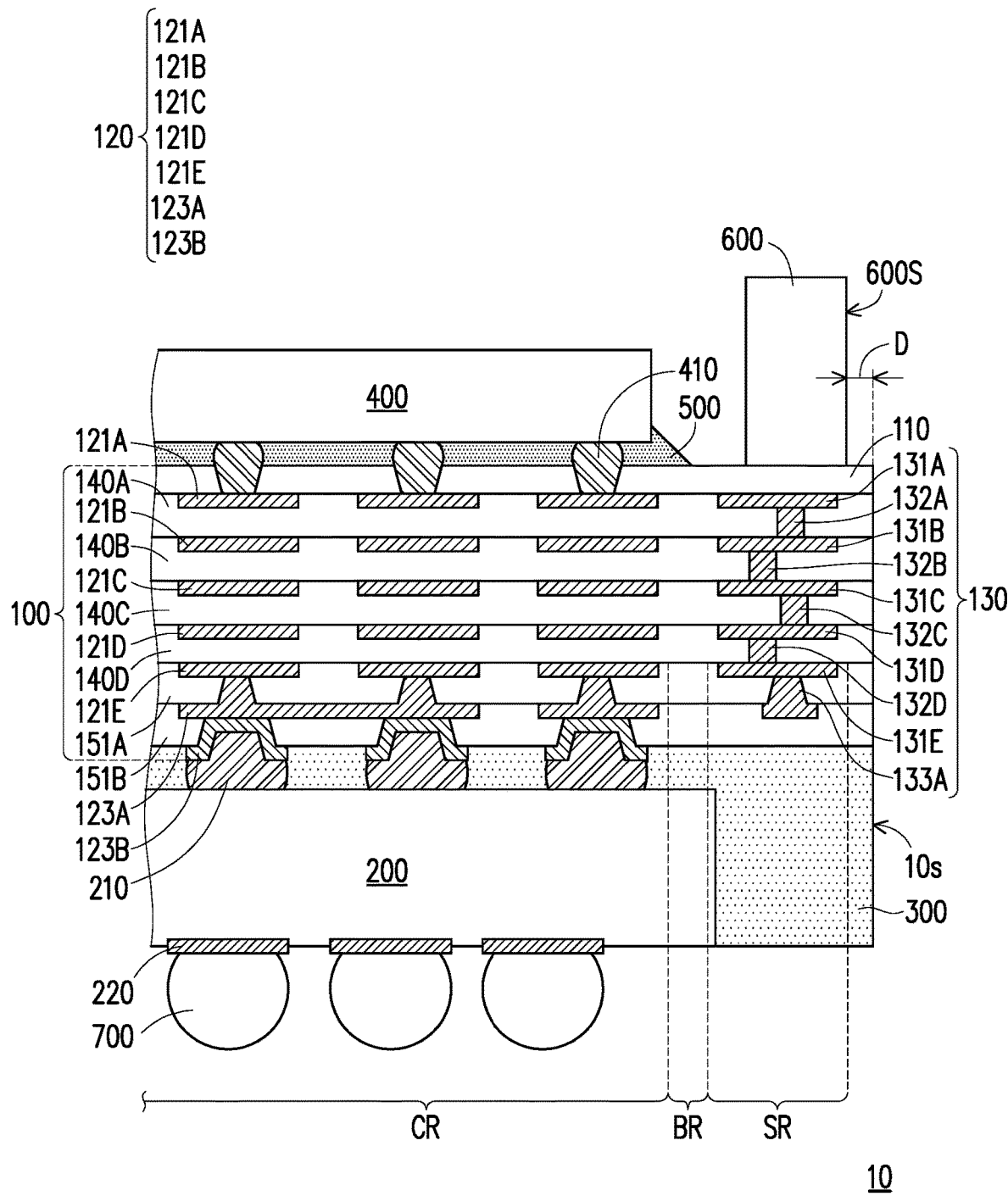
Figure 2:
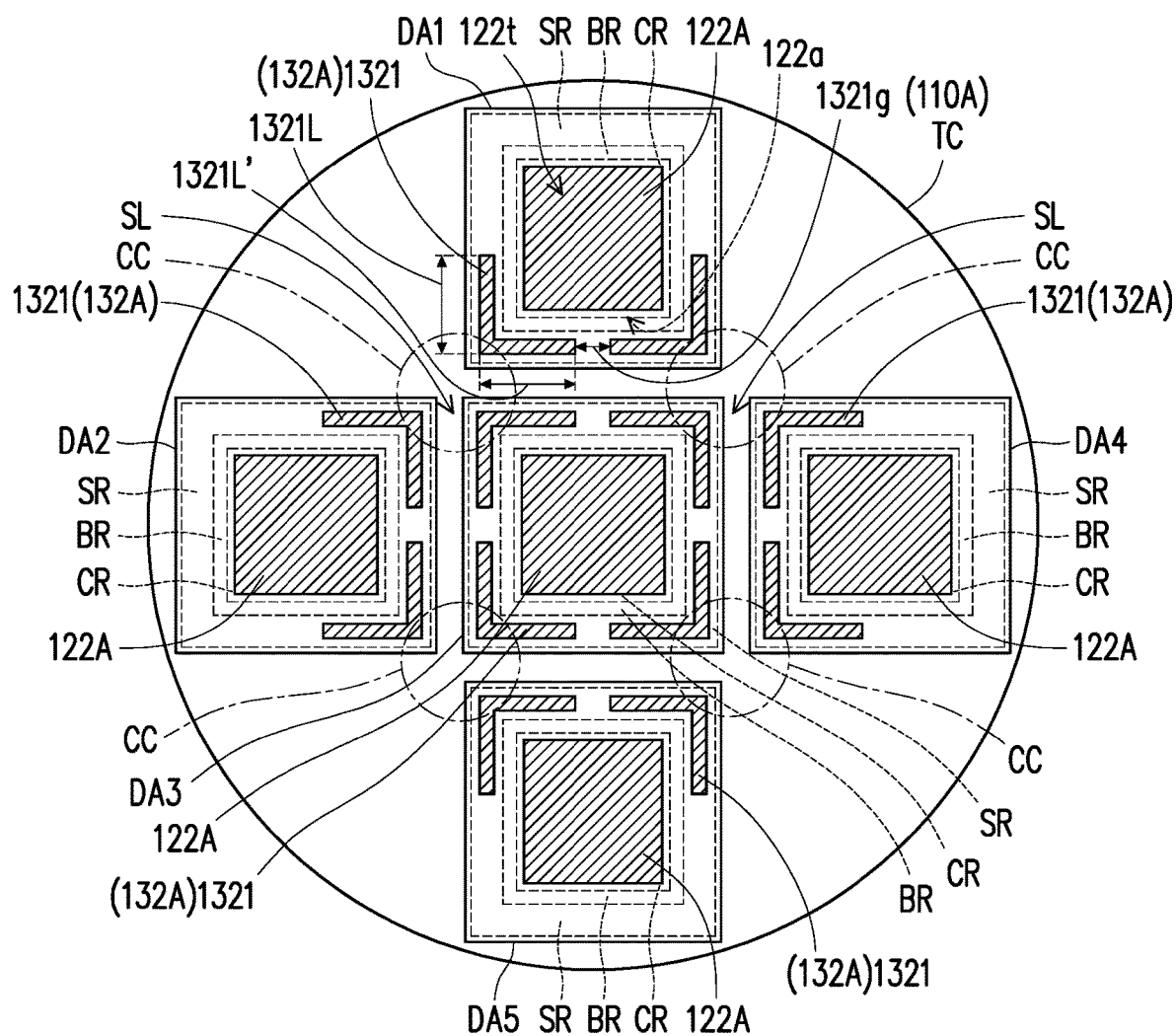
FIG. 2 is a schematic top view of FIG. 1D in accordance with some embodiments.
Figure 3:
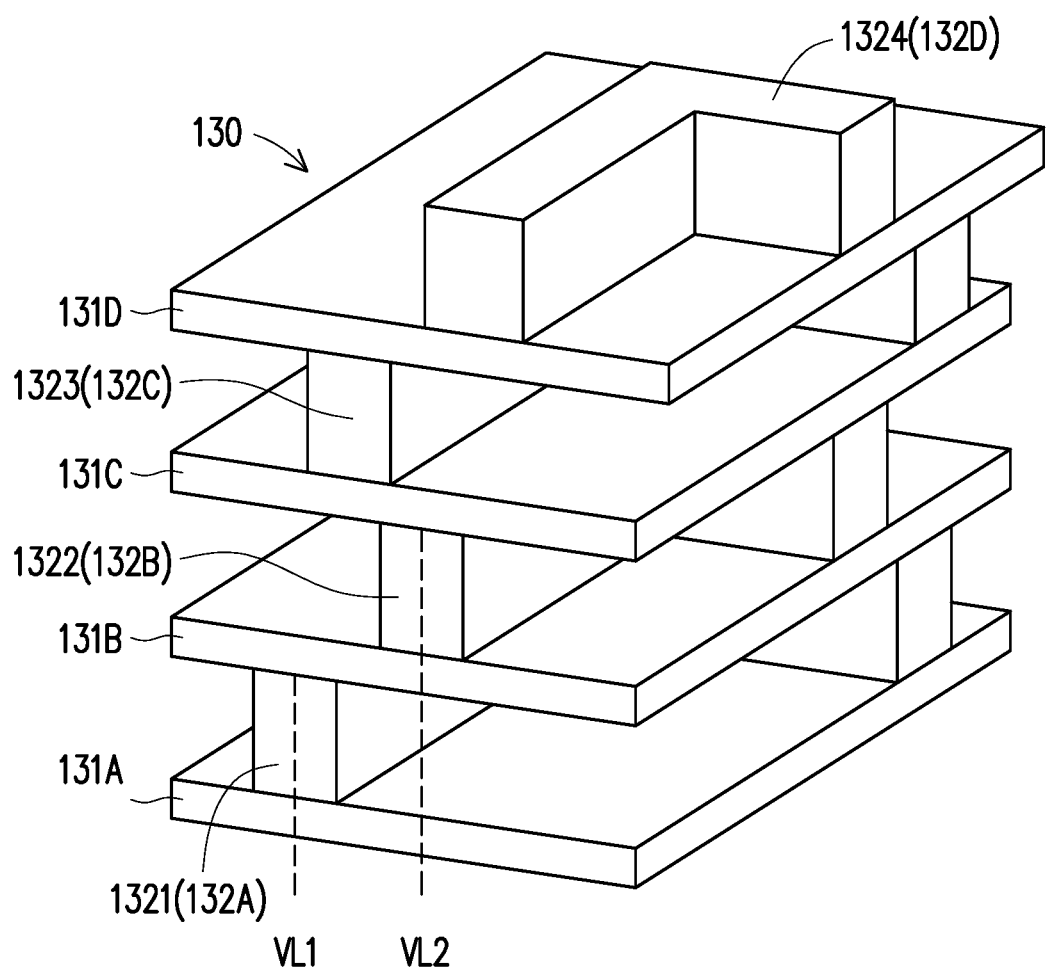
FIG. 3 is a schematic perspective view of a seal ring structure in the dashed area A shown in FIG. 1E in accordance with some embodiments.

FIGS. 1A-1J are schematic cross-sectional views of various stages of manufacturing a semiconductor package in accordance with some embodiments, FIG. 2 is a schematic top view of FIG. 1D in accordance with some embodiments, and FIG. 3 is a schematic perspective view of a seal ring structure in the dashed area A shown in FIG. 1E in accordance with some embodiments.

Referring to FIG. 1A, a dielectric material layer 110A is formed over a temporary carrier TC. For example, the material of the temporary carrier TC includes glass, silicon (e.g., bulk silicon), metal (e.g., steel), ceramic, a combination thereof, multi-layers thereof, or the like. The temporary carrier TC may be in a wafer form or in a panel form. Although any suitable shape of the temporary carrier TC may be provided. In some embodiments, the temporary carrier TC is provided with a release layer (not shown) formed thereon to facilitate de-bonding the temporary carrier TC from the structure formed thereon in the subsequent process. For example, the release layer includes a layer of light-to-heat-conversion (LTHC) release coating and a layer of associated adhesive (e.g. a ultra-violet curable adhesive or a heat curable adhesive layer), or the like. Alternatively, the release layer is omitted.

In some embodiments, the dielectric material layer 110A may be a polymer layer. The dielectric material layer 110A may be or may include polybenzoxazole (PBO), polyimide (PI), benzocyclobutene (BCB), a combination thereof, or the like. Other suitable dielectric material (e.g., solder resist, or Ajinomoto build-up film (ABF), etc.) may be used. In some embodiments in which the temporary carrier TC is provided with the release layer, the dielectric material layer 110A is formed on the release layer. The dielectric material layer 110A may be formed by using any suitable method, such as a spin coating process, a deposition process, and/or the like.

Referring to FIG. 1B, a first interconnect layer 121A and a second interconnect layer 131A is formed on the dielectric material layer 110A. In some embodiments, the first interconnect layer 121A includes contact pads for the subsequently formed structure landing thereon. The first interconnect layer 121A may also include metal lines (not shown) connected to the contact pads, depending on the circuit design. For example, the second interconnect layer 131A is not in contact with the first interconnect layer 121A. The second interconnect layer 131A may be isolated from the first interconnect layer 121A. In some embodiments, the first interconnect layer 121A is formed in a functional circuit region CR and the second interconnect layer 131A is formed in a seal ring region SR encompassing the functional circuit region CR.

In some embodiments, a buffer region BR is between the functional circuit region CR and the seal ring region SR and encircles the functional circuit region CR. The second interconnect layer 131A may be separated from the first interconnect layer 121A by the buffer region BR. The buffer region BR may span a lateral dimension, and the lateral dimension may be non-zero. It is noted that the lateral dimension may be designed depending on the process requirements and construe no limitation in the disclosure. By the configuration of the buffer region BR, the risk of damage to the first interconnect layer 121A and the structure form thereon may be reduced. The buffer region BR may be adjacent to the functional circuit region CR and the seal ring region SR within a device area. It is appreciated that numerous sets of the functional circuit regions CR, the buffer regions BR, and the seal ring regions SR may be defined on a given temporary carrier TC. For illustration, only one set of the regions is shown in FIGS. 1A-1J.

In some embodiments, the formation of the first interconnect layer 121A includes at least the following steps. For example, a seed material layer (not shown) is formed on the dielectric material layer 110A using suitable process such as sputtering, evaporation, or deposition processes, depending upon the desired materials. The seed material layer may be made of material (s) that aids in the formation of a thicker layer during subsequent processing steps. For example, the seed material layer is a metal layer, which may be a single layer (e.g., copper or copper alloys) or a composite layer including sub-layers formed of different materials (e.g., titanium and copper). Next, a photoresist having openings (also not shown) may be formed to partially cover the seed material layer using a spin coating process, lithography and etching process, or other suitable techniques. The conductive material (e.g., copper, titanium, tungsten, aluminum, another metal, the like, or a combination thereof, etc.) may be formed on the seed material layer and in the openings of the photoresist using electroplating or electroless-plating, or other suitable deposition process. Subsequently, the photoresist is removed through a suitable removal process such as ashing or chemical stripping. Those portions of the seed material layer that were covered by the photoresist may be removed by etching or other suitable process. The conductive material may serve as an etch mask when removing those portions of the seed material layer. The remaining portions of the seed material layer and conductive material thereon collectively form the first interconnect layer 121A.

In some embodiments, the first interconnect layer 121A and the second interconnect layer 131A are formed by the same materials, at the same time, and by the same processes. For example, the remaining portions of the seed material layer and conductive material thereon within the functional circuit region CR are referred to the first interconnect layer 121A, and the remaining portions of the seed material layer and conductive material thereon within the seal ring region SR are referred to the second interconnect layer 131A.

Referring to FIG. 1C, a second via pattern 132A is formed on the second interconnect layer 131A. In some embodiments, a first via pattern 122A (shown in FIG. 2) are formed on the first interconnect layer 121A, but may not be seen in the illustrative cross-sectional view. In some embodiments, the second via pattern 132A includes a plurality of features 1321 (labeled in FIG. 2) that may be offset or spaced apart from one another, as will be described in further detail below. The second via pattern 132A may be formed by lithography, etching, and plating processes, or other suitable techniques. A material of the second via pattern 132A may be or may include copper, aluminum, tungsten, silver, metal alloy, combinations thereof, or the like. In some embodiments, the first via pattern 122A formed on the first interconnect layer 121A is formed by the same materials, at the same time, and by the same processes as the second interconnect layer 131A. The first via pattern 122A may be isolated from the second via pattern 132A. In some embodiments, the second via pattern 132A and the first via pattern 122A have rectangular shaped cross-sectional profiles. It is appreciated that other cross-sectional profiles may be used, such as a trapezoidal shape or the like.

Referring to FIG. 1D and FIG. 2, an insulating layer 140A is formed on the dielectric material layer 110A to cover the first interconnect layer 121A, the first via pattern 122A, the second interconnect layer 131A, and the second via pattern 132A. The insulating layer 140A may also cover the first via pattern 122A that is formed on the first interconnect layer 121A in the functional circuit region CR. The second via pattern 132A and the first via pattern 122A formed on the first interconnect layer 121A may be accessibly revealed by the insulating layer 140A for further connection.

The insulating layer 140A may be or may include a lamination film. For example, a material of the insulating layer 140 includes ABF, die attach film (DAF), prepreg, resin coated copper (RCC), a polymer material (e.g., PBO, PI, BCB), a molding compound, and/or the like. The insulating layer 140A may have a Young's modulus ranging from about 3 GPa to about 20 GPa. In some embodiments in which the insulating layer 140A is formed of ABF, the ABF is laminated on the structure shown in FIG. 1C, and external energy (e.g., heat and/or pressure) may be applied to soften the ABF, so that a flat-top surface is formed. In some embodiments, applying the external energy helps the insulating layer 140A to fill into the spaces between the first interconnect layer 121A and the second interconnect layer 131A. Other technique (e.g., spin-coating, chemical vapor deposition (CVD), physical vapor deposition (PVD), the like, a combination thereof, etc.) may be used to form the insulating layer 140A. A planarization process is optionally performed to level the insulating layer 140A, the second via pattern 132A, and the first via pattern 122A. For example, the top surface 132t of the second via pattern 132A and the top surface 122t of the first via pattern 122A are substantially leveled with the top surface 140t of the insulating layer 140A. In some embodiments, the top surface 140t of the insulating layer 140A is higher than the top surface 132t of the second via pattern 132A and the top surface 122t of the first via pattern 122A, relative to the top surface of the dielectric material layer 110A. For example, the difference between the top surface 140t of the insulating layer 140A and the top surface 132t of the second via pattern 132A (or the top surface 122t of the first via pattern 122A) is about 2 µm.

Continue to FIG. 2, a plurality of device areas (DA1, DA2, DA3, DA4, and DA5) may be distributed in rows and columns over the temporary carrier TC in the top view. In some embodiments, the periphery of each device area (DA1, DA2, DA3, DA4, and DA5) is square or rectangular in shape. Other shapes (circle, ellipse, polygon, etc.) may be possible in accordance with other embodiments. In some embodiments, the device areas (DA1, DA2, DA3, DA4, and DA5) are spaced from one another by a scribe area SL. For example, the semiconductor structure is separated by cutting in the scribe area SL between and circumscribing device areas (DA1, DA2, DA3, DA4, and DA5) during a singulation process. It is noted that the first via pattern 122A shown in FIG. 2 is illustrated in a schematic and simplified manner, and the first via pattern 122A may include various route features combined in various ways depending on circuit design.

In some embodiments, the second via pattern 132A of each device area (DA1, DA2, DA3, DA4, or DA5) may include the features 1321 arranged in a discontinuous manner along at least a portion of the perimeter of the corresponding functional circuit region CR. In some embodiments, as shown in FIG. 2, the device areas (DA1, DA2, DA4, and DA5) are arranged at the periphery of the array, and the device area DA3 arranged in the middle of the array. The second via patterns 132A of the device areas (DA1, DA2, DA4, and DA5) may be formed at two neighboring corners that are close to the device area DA3. In some embodiments, the features 1321 of the second via pattern 132A of the device area DA3 are formed at each corner of the functional circuit region CR. In some embodiments, each of the device areas (DA1, DA2, DA3, DA4, and DA5) includes the second via pattern 132A formed at each corner of the corresponding functional circuit region CR.

In some embodiments, the features 1321 of the second via pattern 132A in each device area may be arranged in an end-to-end manner in the top view. The ends of the features 1321 may be spaced apart from one another by the pitch 1321g. The insulating layer 140A is formed between the ends of the features 1321 to isolate the features 1321 from one another. For example, the pitch 1321g between the adjacent features 1321 is non-zero. The pitch 1321g may be less than a length of the corresponding side 120a of the functional circuit region CR. In some embodiments, the pitch 1321g is about 29 µm. The pitch 1321g may be greater than 29 µm in accordance with some other embodiments. It is noted that the pitch 1321g may vary and scale with device size, process technology, and manufacturer, and the pitch is not restricted. In some embodiments, each feature 1321 has a generally rectangular shape along its length in the top view. In some embodiments, the feature 1321 formed at each corner of the seal ring region SR in an L-shape includes the length 1321L extending along a first direction and the length 1321L' extending along a second direction. The first direction and the second direction may be substantially perpendicular to each other. The lengths (1321L and 1321L') of the respective feature 1321 may be substantially the same. Alternatively, the lengths (1321L and 1321L') of the respective feature 1321 are different, so that the feature 1321 may have a long side and a short side connected to the long side. The features 1321 of the second via pattern 132A may be formed in any suitable shape, such as a rectangular shape, a T-shape, an octagon-shape, a right triangle-shape, a cross-shape, combinations thereof, etc. The various dimensions of the feature 1321, such as the length, width, and distance of the gap, may include any suitable value, and these values may depend on process and/or product requirements.

Referring to FIG. 1E and FIG. 3, additional interconnect layers, additional via patterns, and additional insulating layers may then be formed over the insulating layer 140A, the first via pattern 122A, and the second via pattern 122A. For example, the first interconnect layer 121B is formed on the insulating layer 140A and the first via pattern 122A (labeled in FIG. 2) corresponding to the functional circuit region CR. The first interconnect layer 121B may be in physical and electrical contact with the first via pattern 122A. The second interconnect layer 131B may be formed on the insulating layer 140A and the second via pattern 122A corresponding to the seal ring region SR to be in physical and electrical contact with the second via pattern 122A. The first interconnect layer 121B and the second interconnect layer 131B at the second level may include the same or similar material as the interconnect layers at the first level. For example, the second interconnect layer 131B is formed simultaneously as, and may be formed of a same material as, the first interconnect layer 121B.

Next, the second via pattern 132B including a plurality of features 1322 may be formed on the second interconnect layer 131B within the seal ring region SR. The first via pattern (not shown) may be formed on the first interconnect layer 121B in the functional circuit region CR by a same material, at a same time, and by a same process as the second via pattern 132B. The first via pattern and the second via pattern 132B at the second level may include the same or similar materials as the underlying interconnect layers. Subsequently, the insulating layer 140B may be formed on the insulating layer 140A to cover the first interconnect layer 121B, the first via pattern (not shown), the second interconnect layer 131B, and the second via pattern 132B. The forming process and the material of the insulating layer 140B may the same or similar as the underlying insulating layer 140A, so the detailed descriptions are not repeated for simplicity.

In some embodiments, the sequence of these process steps is repeated several times with simultaneous processes performed for the circuits (e.g., first interconnect layers (121C, 121D, and 121E) and first via pattern vertically connecting adjacent first interconnect layers) and the seal ring structures (e.g., second interconnect layer (131C, 131D, and 131E) and the second via pattern (132C and 132D) vertically connecting adjacent second interconnect layers) covered by the insulating layers (140C and 140D). Although four of the insulating layers and the interconnect layers and five of the via patterns are illustrated in FIG. 1E, any number of the insulating layers, the interconnect layers, and the via patterns may be formed over the temporary carrier TC. The second interconnect layers (131A-131E) and the second via patterns (132A-132D) formed in the seal ring region SR may be viewed as a seal ring structure 130. The first interconnect layers (121A-121E) and the first via patterns (not shown) formed in the functional circuit region CR may be viewed as a functional circuit structure 120.

Continue to FIG. 3, it is noted that the second interconnect layer 131E of the seal ring structure 130 and the insulating layers (140A-140D) covering the seal ring structure 130 are not shown for clarity. The features 1322 of the second via pattern 132B at the second level may be formed in an L-shape. In some embodiments, the features (1323 and 1324) of the second via pattern (132C and 132D) are also formed in an L-shape. It is noted that the configurations of the features (1321-1324) of the second via pattern (132A-132D) may be replaced with any configuration of the second via pattern described elsewhere herein, and variations thereof may be carried out while still remaining within the disclosure.

In some embodiments, at least two adjacent levels of the second via patterns are misaligned from one another. For example, the features 1322 of the second via pattern 132B at the second level is laterally offset relative to the features 1321 of the second via pattern 132A at the first level in the cross section. The features 1322 of the second via pattern 132B formed on the second interconnect layer 131B and the features 1321 of the second via pattern 132A formed on the second interconnect layer 131A may be staggered. In some embodiments, in the cross-sectional view, a vertical centerline VL2 of the feature 1322 of the second via pattern 132B at the second level is offset from a vertical centerline VL1 of the feature 1321 of the second via pattern 132A at the first level. In some embodiments, in the cross-sectional view, the features (1321 and 1323) at the first and third levels are substantially aligned, the features (1322 and 1324) at the second and fourth levels are substantially aligned, and the feature 1321 at the first level may be misaligned with the feature 1322 at the second level. In some embodiments, the second via pattern at each level is staggered from one level of the second via patterns, in the cross-sectional view. Alternatively, the second via patterns (132A-132D) may be aligned or may be slightly misaligned with one another due to formation and/or alignment process variations.

Turning back to FIG. 1E, a dielectric layer 151A may be formed on the first interconnect layer 121E and the second interconnect layer 131E. In some embodiments, the dielectric layer 151A is formed differently from the underlying insulating layers (140A-140D). For example, the insulating layers (140A-140D) may be formed of a material such as ABF, while the dielectric layer 151A may be formed from a different material and/or a different thickness, such as by being formed of polymer material (e.g., PBO, PI, BCB, etc.). In some embodiments, the Young's modulus of the dielectric layer 151A may be less than that of one of the underlying insulating layers (140A-140D). For example, the dielectric layer 151A serves as stress buffer layer. However, any combination of materials may be utilized. In some embodiments, a dielectric material is formed by a suitable process, such as spin-on coating, CVD, PVD, and/or the like, and then the dielectric material is patterned to form the dielectric layer 151A having openings that expose at least portions of underlying conductive features (e.g., the first interconnect layer 121E and the second interconnect layer 131E).

The seal ring structure 130 may further include the patterned conductive layer 133A, and the functional circuit structure 120 may further include the patterned conductive layer 123A. For example, the patterned conductive layers 123A and 133A may be respectively formed on the dielectric layer 151A and into the openings of the dielectric layer 151A to be in physical contact with the underlying conductive features (e.g., first interconnect layer 121E and the second interconnect layer 131E). For example, the patterned conductive layer 123A is formed within the functional circuit region CR to be electrically connected to the first interconnect layer 121E at the topmost level of the functional circuit stack, and the patterned conductive layer 133A is formed within the seal ring region SR at the topmost level of the seal ring stack. The patterned conductive layer 123A may be formed by a same material, at a same time, and by a same process as the patterned conductive layer 133A. In some embodiments, the via portions of the patterned conductive layers 123A and 133A laterally covered by the dielectric layer 151A have tapered profiles. Alternatively, the sidewalls of the via portions of the patterned conductive layers 123A and 133A are substantially vertical. In some embodiments, the patterned conductive layer 133A is omitted.

The dielectric layer 151B and the patterned conductive layer 123B are optionally formed on the dielectric layer 151A. For example, the dielectric layer 151B having openings is formed on the dielectric layer 151A to cover the patterned conductive layers 123A and 133A, and then the patterned conductive layer 123B is formed on the dielectric layer 151B and extends into the openings of the dielectric layer 151B to be in physical and electrical contact with the patterned conductive layer 123A. In some embodiments, only patterned conductive layer 123A is accessibly revealed by the openings of the dielectric layer 151B, and the patterned conductive layer 123B is buried in the dielectric layer 151B. Alternatively, at least a portion of the patterned conductive layer 123B is accessibly revealed by the dielectric layer 151B for further connection.

In some embodiments, the patterned conductive layer 123B and the underlying patterned conductive layer 123A are formed within the functional circuit region CR. The functional circuit structure 120 may further include the patterned conductive layer 123B. In some embodiments, the patterned conductive layer 123B includes under-bump metallization (UBM) pads formed on the patterned conductive layer 123A. For example, the UBM pad may include multi-layers of conductive materials, such as a layer of titanium, a layer of copper, and a layer of nickel. Although other arrangements of conductive materials (e.g., copper/nickel/gold or the like) and layers may be used. In some embodiments, the dielectric layer 151B and the patterned conductive layer 123B are omitted, and the patterned conductive layer 123A includes UBM pads for further electrical connection.

Referring to FIG. 1F, a first semiconductor device 200 is placed on the patterned conductive layer 123B. In some embodiments, each of the device areas (shown in FIG. 2) includes at least one first semiconductor devices 200 mounted thereon. In some embodiments, a plurality of first semiconductor devices 200 is mounted within the device area. For example, conductive terminals 210 of the first semiconductor device 200 are substantially coupled to the respective UBM pad of the patterned conductive layer 123B by a bonding process (e.g., a reflow process). The conductive terminals 210 may be or may include ball grid array (BGA), controlled collapse chip connection (C4) bumps, solder balls, electroless nickel-electroless palladium-immersion gold (ENEPIG) formed bumps, and/or the like. In some embodiments, the first semiconductor device 200 has the conductive terminals 210 distributed at one side, and contact pads 220 distributed at the opposing side for further electrical connection. Alternatively, the contact pads 220 are omitted.

The first semiconductor device 200 may be or may include one or more semiconductor dies, such as a logic die (e.g., central processing unit (CPU), graphics processing unit (GPU), system-on-a-chip (SoC), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof. In some embodiments, the first semiconductor device 200 includes more than one of the same types of die, or may include different types of dies. The above examples are provided for illustrative purposes only, and other embodiments may utilize additional elements for a given application.

Referring to FIG. 1G, an insulating encapsulation 300 is formed on the dielectric layer 151B to cover the first semiconductor device 200. The insulating encapsulation 300 may extend along the sidewalls 200s of the first semiconductor device 200 and may be in contact with (or surround) the conductive terminals 210 and the patterned conductive layer 123B. In some embodiments, the insulating encapsulation 300 includes molding compound, epoxy, or the like, and may be formed by compression molding, transfer molding, or the like. In some embodiments, the insulating encapsulation 1300 includes a molding underfill. In some embodiments, a release film RF is attached to the first semiconductor device 200 and covers the contact pads 220, and then the insulating material is laterally dispensed and flows through the gaps between the first semiconductor device 200 and the dielectric layer 151B. A curing process may be performed to solidify the insulating material, and then the release film RF is removed to accessibly reveal the contact pads 220. It is noted that the release film RF is illustrated in phantom to show it may not be present after the formation of the insulating encapsulation. In some embodiments in which a plurality of first semiconductor devices 200 mounted on the device areas, the insulating encapsulation 300 overlying the dielectric layer 151B laterally covers each of the first semiconductor devices 200 for protection. In some other embodiments, the first semiconductor devices 200 are buried in the insulating encapsulation 300.

Referring to FIG. 1H and also with reference to FIG. 1G, the temporary carrier TC is removed to expose the dielectric material layer 110A. The resulting structure shown in FIG. 1G may be turned upside down and placed on a tape frame TF for further processing. In some embodiments, the temporary carrier TC is released from the dielectric material layer 110A using a thermal process to alter the adhesive properties of the release layer (not shown) disposed between the dielectric material layer 110A and the temporary carrier TC. Other processes (e.g., grinding, mechanical peeling, etching, combinations thereof, or the like) may be used. In some embodiments, after de-bonding the temporary carrier TC, the resulting structure may be flipped over to be attached to the tape frame. In some other embodiments, the step of flipping is performed prior to the de-bonding process.

After the dielectric material layer 110A is exposed, a portion of the dielectric material layer 110A may be removed to form the dielectric layer 110 having openings 110p. For example, the dielectric layer 110 is formed by lithography and etching, laser drilling, or other suitable patterning process. The openings 110p of the dielectric layer 110 may accessibly reveal at least a portion of the first interconnect layer 121A in the functional circuit region CR for further electrical connection. For example, the contact pads of the first interconnect layer 121A are accessibly revealed by the openings 110p of the dielectric layer 110 for the subsequently formed structure landing thereon. In some embodiments, the inner sidewalls of the dielectric layer 110 that define the openings 110p are inclined. For example, the openings 110p of the dielectric layer 110 have tapered profiles. In some embodiments, the openings 110p of the dielectric layer 110 are tapered toward the first interconnect layer 121A. The openings 110p of the dielectric layer 110 and the via portions of the patterned conductive layer 123A may be tapered toward the opposing directions.

Referring to FIG. 1I and also with reference to FIG. 1H, a singulation process is performed and a second semiconductor device 400 may be placed on the dielectric layer 110 and electrically coupled to the first interconnect layer 121A. For example, a pre-soldering process is optionally performed on the exposed surfaces of the first interconnect layer 121A within the openings 110p of the dielectric layer 110. Next, the singulation process is performed to separate the resulting structure into a plurality of semiconductor structures. The singulation process may be performed using any suitable dicing tool (e.g., a blade, a saw, a laser drill, an etching process, and the like, or combinations thereof) to cut through materials of the different layers along the scribe area (shown in FIG. 2). For example, the dicing tool cuts through the dielectric layer 110, the underlying insulating layers (140A, 140B, 140C, and 140D), the underlying dielectric layers (151A and 151B), and the underlying insulating encapsulation 300. After the singulation process, the dielectric layer 110, the underlying insulating layers (140A, 140B, 140C, and 140D), the underlying dielectric layers (151A and 151B), and the underlying insulating encapsulation 300 may have substantially coterminous sidewalls 100s. In some embodiments, the dielectric layer 110, the underlying insulating layers (140A, 140B, 140C, and 140D), the metal structure (e.g., including the functional circuit structure 120 and the seal ring structure 130) in the insulating layers (140A, 140B, 140C, and 140D), the underlying dielectric layers (151A and 151B), the patterned conductive layers (123A, 123B, and 133A) are collectively viewed as a package component 100. In some embodiments, the package component 100 is referred to as the package substrate.

In some embodiments, the semiconductor structures are removed from the tape frame TF after the singulation process. Next, the second semiconductor device 400 is disposed on the dielectric layer 110 after removing the tape frame TF. In some other embodiments, placing the second semiconductor device 400 is performed prior to removing the tape frame TF. For example, contact bumps 410 of the second semiconductor device 400 extend into the openings 110p of the dielectric layer 110 and mounted on the first interconnect layer 121A. The contact bumps 410 of the second semiconductor device 400 may be or may include solder balls, although any suitable types of electrical connectors may be utilized. In some embodiments, the contact bumps 410 of the second semiconductor device 400 are in contact with the pre-solder layer (not shown), a reflow process may be performed to bond the contact bumps 410 of the second semiconductor device 400 to the first interconnect layer 121A. After the reflow process, the contact bumps 410 may fill the openings 110p of the dielectric layer 110. Other bonding techniques (e.g., thermos-compression bonding, hybrid bonding, metal-to-metal bonding, or the like) may be used to couple the second semiconductor device 400 to the first interconnect layer 121A.

The second semiconductor device 400 may be or may include one or more semiconductor dies, such as a logic die (e.g., CPU, GPU, SoC, microcontroller, etc.), a memory die (e.g., DRAM die, SRAM die, etc.), a power management die (e.g., PMIC die), a RF die, a sensor die, a MEMS die, a signal processing die (e.g., DSP die), a front-end die (e.g., AFE dies), the like, or combinations thereof. In some embodiments, the second semiconductor device 400 includes more than one of the same types of die, or may include different types of dies. In some embodiments, the second semiconductor device 400 performs the same function as the first semiconductor device 200. Alternatively, the second semiconductor device 400 and the first semiconductor device 200 perform different functions. The above examples are provided for illustrative purposes only, and other embodiments may use additional elements for a given application.

In some embodiments, after the second semiconductor device 400 is coupled to the first interconnect layer 121A, an underfill layer 500 is formed on the dielectric layer 110. In some embodiments, after removing the tape frame TF, the second semiconductor device 400 is disposed over the package component 100, and then the underfill layer 500 is formed. In some other embodiments, forming the underfill layer 500 is performed prior to removing the tape frame TF. For example, the underfill layer 500 fills the gap between the dielectric layer 110 and the second semiconductor device 400 to surround the contact bumps 410 for protection. The underfill layer 500 may extend along the sidewalls 400s of the second semiconductor device 400. The underfill layer 500 may include a liquid epoxy that is dispensed between the second semiconductor device 400 and the dielectric layer 110 and then cured to harden. The underfill layer 500 may be formed by a capillary flow process after the second semiconductor device 400 is attached, or may be formed by a suitable deposition method before the second semiconductor device 400 is attached. In other embodiments, no underfill is uses. The underfill layer 500 may be replaced with a molding compound formed by a molding process.

Referring to FIG. 1J, a retaining ring 600 may be attached to the dielectric layer 110 and surround the second semiconductor device 400. In some embodiments, after forming the underfill layer 500, the retaining ring 600 is placed on the dielectric layer 110. In some other embodiments, placing the retaining ring 600 is performed prior to removing the tape frame TF. The retaining ring 600 may be used to protect the second semiconductor device 400, to add stability to the resulting structure, to dissipate heat from the second semiconductor device 400, and/or to provide a distributed heat transfer from the underlying metal structure to the environment. A material of the retaining ring 600 may be or may include steel, stainless steel, copper, aluminum, gold, metal alloy, ceramic, combinations thereof, or the like. An adhesive layer (not shown) is optionally disposed between the retaining ring 600 and the dielectric layer 110 to secure the retaining ring 600 to the dielectric layer 110. In some embodiments, the adhesive layer includes a thermal interface material (TIM) layer. The height of the retaining ring 600 may be greater than the thickness of the second semiconductor device 400. In other embodiments, the height of the retaining ring 600 is less than the thickness of the second semiconductor device 400. In some embodiments, the outer sidewall 600S of the retaining ring 600 is not aligned with the coterminous sidewalls 100 of the package component 100. For example, the difference D between the outer sidewall 600S of the retaining ring 600 and the coterminous sidewalls 10s is about 10 μm. It is noted that the difference D may vary depending on product and process requirements. Alternatively, the retaining ring 600 and the adhesive layer attached to the retaining ring 600 are omitted.

In some embodiments, a plurality of external connectors 700 is formed on the contact pads 220 of the first semiconductor device 200 for further electrical connection after placing the retaining ring 600. The external connectors 700 may be formed as any suitable connector (e.g., BGAs, C4 bumps, solder balls, or the like). In some embodiments, the external connectors 700 are formed by a ball mounting process on the exposed portions of the contact pads 220 to be electrically coupled to the first semiconductor device 200. In some embodiments in which the first semiconductor device 200 does not include the contact pads 220, the external connectors 700 are omitted. Up to here, manufacturing a semiconductor package 10 is substantially complete.

In some embodiments, the semiconductor package 10 includes the insulating encapsulation 300 laterally covering the first semiconductor device 200, and the underfill layer 500 disposed between the second semiconductor device 400 and the package component 100 for protection. The semiconductor package 10 optionally includes the retaining ring 600 surrounding the second semiconductor device 400 for protection and stability improvements. In some other embodiments, the seal ring structure 130 of the package component 100 is thermally coupled to the retaining ring 600 for thermal dissipation. The first semiconductor device 200 and the second semiconductor device 400 may be located at two opposite sides of the package component 100 and electrically connected to the functional circuit structure 120 of the package component 100.

The package component 100 of the semiconductor package 10 includes the seal ring structure 130 located within the seal ring region SR, and the functional circuit structure 120 located within the functional circuit region CR. The seal ring structure 130 is electrically isolated from the functional circuit structure 120 and may be electrically floating in the package component 100. Since the seal ring structure 130 is arranged to at least partially surround the functional circuit structure 120 at each level, the seal ring structure 130 may provide protection to the functional circuit structure 120 from the crack propagation during the processes (e.g., debonding the temporary carrier TC or tape frame TH, singulation, laser drilling, etc.).

The second via patterns (e.g., 132A, 132B, 132C, 132D) of the seal ring structure 130 at each level in the package component 100 may surround at least two adjacent corners of the functional circuit region CR as a non-continuous line. By such configuration, voids formed in the package component 100 during the lamination process or reliability testing may also be eliminated. If the second via pattern is formed as a closed-loop ring, voids generating in the respective level of the package component 100 will be retained in the area confined by the second via pattern. The presence of the voids in the package component may deleteriously affect performance of the package component. For example, when the warpage issue arises, cracks may develop and/or propagate due to the presence of the voids. Experience has shown that for the device areas arranged in the array as shown in FIG. 2, corner regions CC are the areas where potential cracking would be concentrated. Thus, the second via patterns of the seal ring structure 130 disposed on these corner regions CC and arranged in a discontinuous manner may provide protection to the functional circuit structure 120 in the functional circuit region CR from cracking and also ensure a void-free environment of the package component 100. It is understood that additional features can be added in the seal ring structure 130, and some features of the second via pattern described herein may be replaced or eliminated for additional embodiments of the seal ring structure.

Figure 4A:
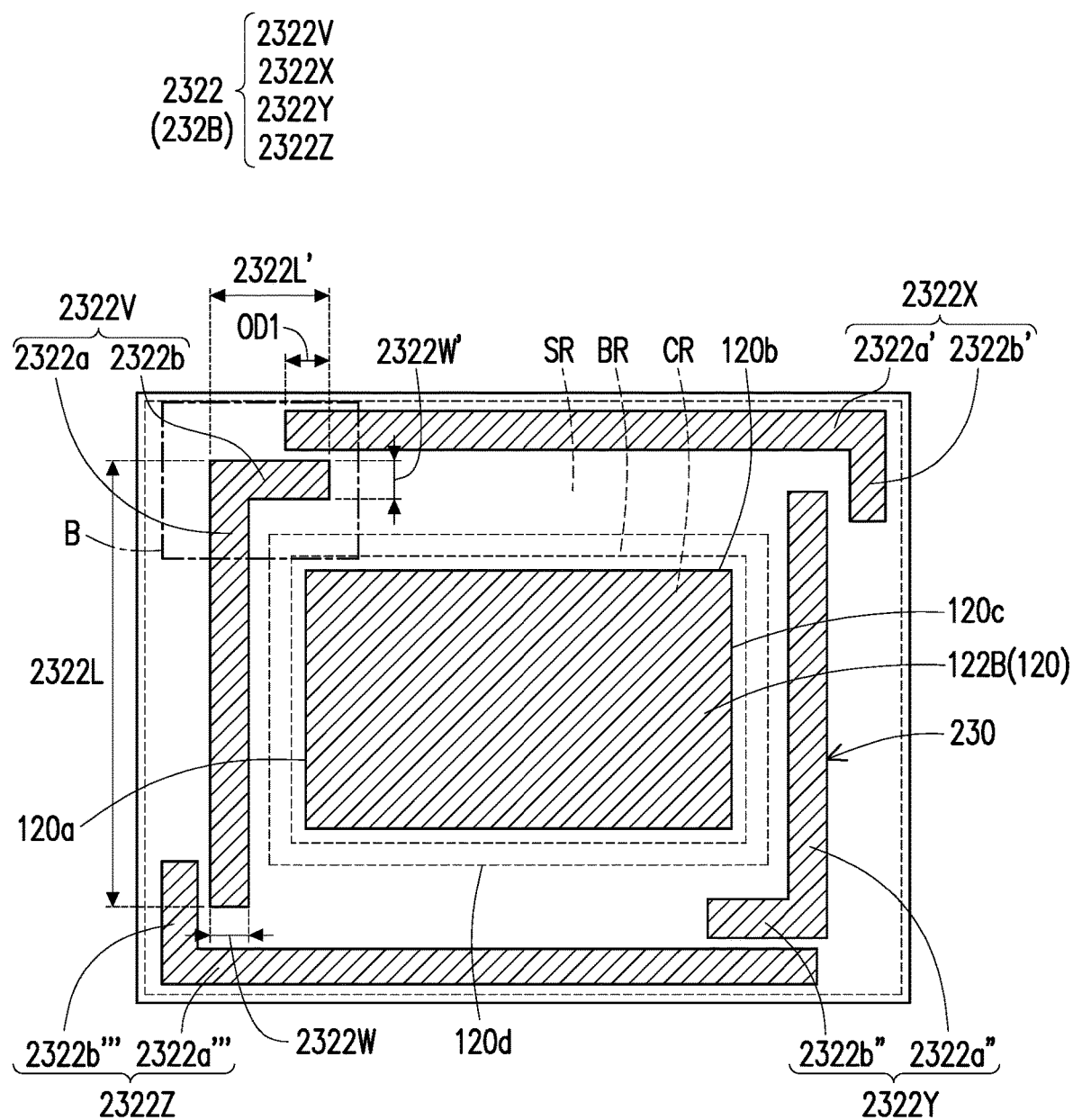
FIG. 4A is a schematic top view of a package component having a seal ring structure in accordance with some embodiments.
Figure 4B:
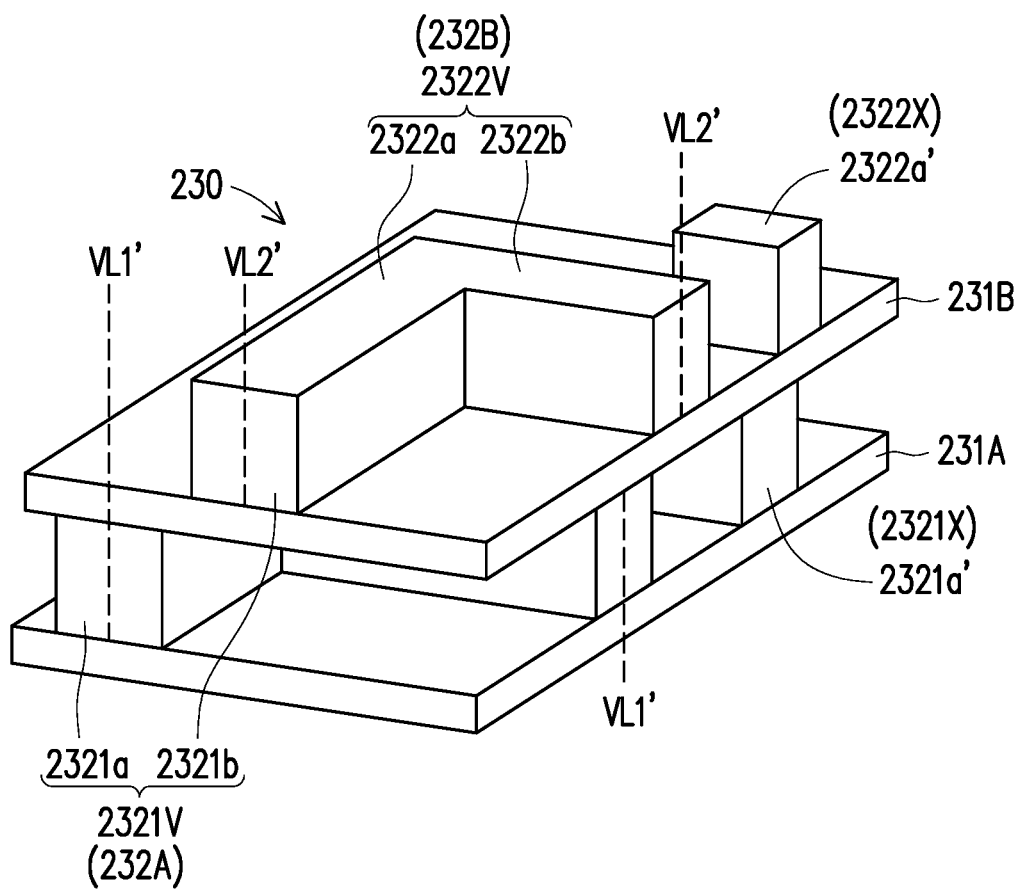
FIG. 4B is a schematic perspective view of a seal ring structure B shown in FIG. 4A in accordance with some embodiments.

FIG. 4A is a schematic top view of a package component having a seal ring structure in accordance with some embodiments, and FIG. 4B is a schematic perspective view of a seal ring structure B shown in FIG. 4A in accordance with some embodiments. Unless specified otherwise, the materials and the formation methods of the components are essentially the same as the like components, which are denoted by like reference numerals shown in FIGS. 1A-3. It is noted that the insulating layer covering the functional circuit structure and the seal ring structure is omitted for ease of illustration. It is also noted that two-layered seal ring structure is shown for illustrative only, and the seal ring structure is not limited to any specific number of layers in the disclosure.

Referring to FIGS. 4A-4B, the seal ring structure 230 located within the seal ring region SR at least includes the second interconnect layers (231A and 231B) and the second via patterns (232A and 232B). The second via pattern 232A may connect adjacent second interconnect layers (231A and 231B), and the second via pattern 232B may be disposed on the second interconnect layer 231B. The functional circuit structure 120 including the first via patterns (e.g., 122B) and the first interconnect layers (not shown) is formed in the functional circuit region CR and may be surrounded by the seal ring region SR. The second via patterns and the second interconnect layers located within the seal ring region SR may be formed simultaneously with the equivalent metal levels of the functional circuit structure 120 located within the functional circuit region CR. The seal ring structure 230 may be spaced apart from the functional circuit structure 120 by the buffer region BR. The buffer region BR may be interposed between the seal ring region SR and the functional circuit region CR to prevent damage to the functional circuit structure 120 in the functional circuit region CR.

In some embodiments, the second via pattern 232B of the seal ring structure 230 includes a plurality of features 2322 spaced apart from one another. At least one of the features 2322 may be formed in an L-shape. For example, each feature (e.g., 2322V, 2322X, 2322Y, 2322Z) includes a first side 2322a and a second side 2322b connected to the first side 2322a. The first side 2322a of the respective feature 2322 may extend along a first side 120a of the functional circuit region CR, and the second side 2322b of the respective feature 2322 may extend along a second side 120b of the functional circuit region CR that is connected to the first side 120a. The first side 120a and the second side 120b may be substantially perpendicular to each other. For example, the first side 2322a and the second side 2322b form a right angle therebetween. Alternatively, the first side 2322a and the second side 2322b may not be perpendicular to each other. For example, an acute angle or an obtuse angle may be formed between the first side 2322a and the second side 2322b. In some embodiments, a length 2322L of the first side 2322a is greater than a length 2322L' of the second side 2322b. Under this scenario, the first side 2322a is referred to as the long side of the respective feature 2322 and the second side 2322b is referred to as the short side of the feature 2322. In some embodiments, a width 2322W of the first side 2322a of the respective feature 2322 is substantially the same as a width 2322W' of the second side 2322b of the respective feature 2322V. Alternatively, the widths (2322W and 2322W') may be different.

In some embodiments, the features 2322 are all formed in the L-shape. For example, each feature (e.g., 2322V, 2322X, 2322Y, and 2322Z) has substantially the same width and length. In some other embodiments, the length and/or width of the features 2322 may be different. Alternatively, the features 2322 disposed at corners may be formed in different shapes. In some embodiments, the features 2322 located within the seal ring region SR may be flipped vertically, flipped horizontally, rotated 90 degrees, rotated 180 degrees, or combinations thereof, in the top view. For example, the first feature 2322V is disposed in proximity to the first side 120a of the functional circuit region CR and has the first side 2322a (e.g., the long side) extending parallel to the first side 120a. The first side 2322a of the first feature 2322V may be longer than the first side 120a of the functional circuit region CR, and the second side 2322b of the first feature 2322V may be shorter than the second side 120b of the function circuit region CR. Alternatively, the first side 2322a of the first feature 2322V may be shorter than the first side 120a of the functional circuit region CR. In some embodiments, the corner of the first feature 2322V may substantially correspond to the corner of the function circuit region CR.

The second feature 2322X may be, relative to the first feature 2322V, rotated 90 degrees in the clockwise direction. For example, the long side of the second feature 2322X extends parallel to the second side 120b of the functional circuit region CR, and the short side of the second feature 2322X extends along the third side 120c of the functional circuit region CR. In some embodiments, the first feature 2322V and the second feature 2322X may be spatially separated from each other through the insulating layer (not shown). For example, the first side 2322a' of the second feature 2322X and the second side 2322b of the first feature 2322V may be offset lengthwise relative to each other to overlap therewith along their length, and be spaced apart therefrom widthwise. The second side 2322b of the first feature 2322V may be interposed between the functional circuit structure 120 and the first side 2322a' of the second feature 2322X. In some embodiments, the end of the first side 2322a' of the second feature 2322X and the end of the second side 2322b of the first feature 2322V are offset by a lateral distance OD1. The lateral distance OD1 may be non-zero. It is appreciated that the lateral distance OD1 may depend on the product and process requirements and is not limited to any specific value in the disclosure.

In some embodiments, the functional circuit region CR has a generally rectangular shape in the top view, and the features 2322 are arranged along the four sides (e.g., 120a, 120b, 120c, and 120d)) of the functional circuit region CR. The features 2322 of the second via pattern 232B may be arranged separately from one another and along the perimeter of the functional circuit region CR. For example, the arrangement of the third feature 2322Y and the fourth feature 2322Z is similar to the arrangement of the first feature 2322V and the second feature 2322X, but turns 180 degrees in the clockwise direction. The third feature 2322Y may have the first side 2322a" extending along the third side 120c of the functional circuit region CR, and the second side 2322b" connected to the first side 2322" and extending along the fourth side 120d of the functional circuit region CR. The first side 2322a" may be the long side of the L-shape and the second side 2322b" may be the short side of the L-shape. In some embodiments, the third feature 2322Y may be rotated 90 degrees in the clockwise direction, relative to the second feature 2322X. In some embodiments, the third feature 2322Y is offset and spatially separated from the second feature 2322X. For example, the end of the first side 2322a" of the third feature 2322Y is staggered lengthwise relative to the end of the second side 2322b' of the second feature 2322X to overlap therewith along their length, and be spaced apart therefrom widthwise.

The fourth feature 2322Z may be similar to the third feature 2322Y, but rotated 90 degrees in the clockwise direction relative to the third feature 2322Y. The first side 2322a" (e.g., the long side) of the fourth feature 2322Z may extend along the fourth side 120d of the functional circuit region CR, and the second side 2322b" (e.g., the short side) of the fourth feature 2322Z connected to the first side 2322a" may extend along the first side 120a of the functional circuit region CR. The third feature 2322Y, the fourth feature 2322Z, and the first feature 2322V may be staggered and spatially separated from one another. For example, the end of the first side 2322a" of the fourth feature 2322Z is staggered lengthwise relative to the end of the second side 2322b" of the third feature 2322Y to overlap therewith along their length, and be spaced apart therefrom widthwise. The second side 2322b" of the third feature 2322Y may be interposed between the functional circuit structure 120 and the first side 2322a" of the fourth feature 2322Z. The end of the second side 2322b" of the fourth feature 2322Z is staggered lengthwise relative to the end of the first side 2322a of the first feature 2322V to overlap therewith along their length, and be spaced apart therefrom widthwise. The first side 2322a of the first feature 2322V may be interposed between the functional circuit structure 120 and the second side 2322b" of the fourth feature 2322Z.

Continue to FIG. 4B, the arrangement of the features 2322 of the second via pattern 232B formed on the second interconnect layer 231B and the arrangement of the features 2321 of the second via pattern 232A formed on the second interconnect layer 231A may be similar. In some embodiments, the arrangements of the second via pattern 232B and the second via pattern 232A are staggered in a cross section. For example, in the cross-sectional view, a vertical centerline VL2' of the first side 2322a of the first feature 2322V is laterally offset from a vertical centerline VL1' of the first side 2321a of the first feature 2321V. In some embodiments, a vertical centerline VL2' of the second side 2322b of the first feature 2322V at the second level is laterally offset from a vertical centerline VL1' of the second side 2321b of the first feature 2321V at the first level. In some other embodiments, the first sides (2321a and 2322a) of the first features (2321V and 2322V) at adjacent levels are substantially aligned, while the second sides (2321b and 2322b) of the first features (2321V and 2322V) at adjacent levels are staggered. Alternatively, the first sides (2321a and 2322a) of the first features (2321V and 2322V) at adjacent levels are substantially staggered, while the second sides (2321b and 2322b) of the first features (2321V and 2322V) at adjacent levels are substantially aligned. The first side 2321a of the first feature 2321V at the first level may be completely offset from or partially overlap the first side 2322a of the first feature 2322V at the second level, in the top-down view.

Alternatively, the first side 2321a of the first feature 2321V at the first level may be substantially aligned with the first side 2322a of the first feature 2322V at the second level, in the top-down view. In some embodiments, the features 2322 are formed in a T-shape or other suitable shape(s).

In some embodiments, the second via pattern (232A or 232B) of the seal ring structure 230 is replaced with the second via pattern described elsewhere herein, and variations thereof may be carried out while still remaining within the disclosure. It is noted that the arrangement shown in FIG. 4B is for illustrative purposes only, and the second via patterns of the seal ring structure 230 may have different shapes in the top view. It is appreciated that the seal ring structure may include additional features or fewer features at different levels for eliminating voids and preventing cracking.

Figure 5A:
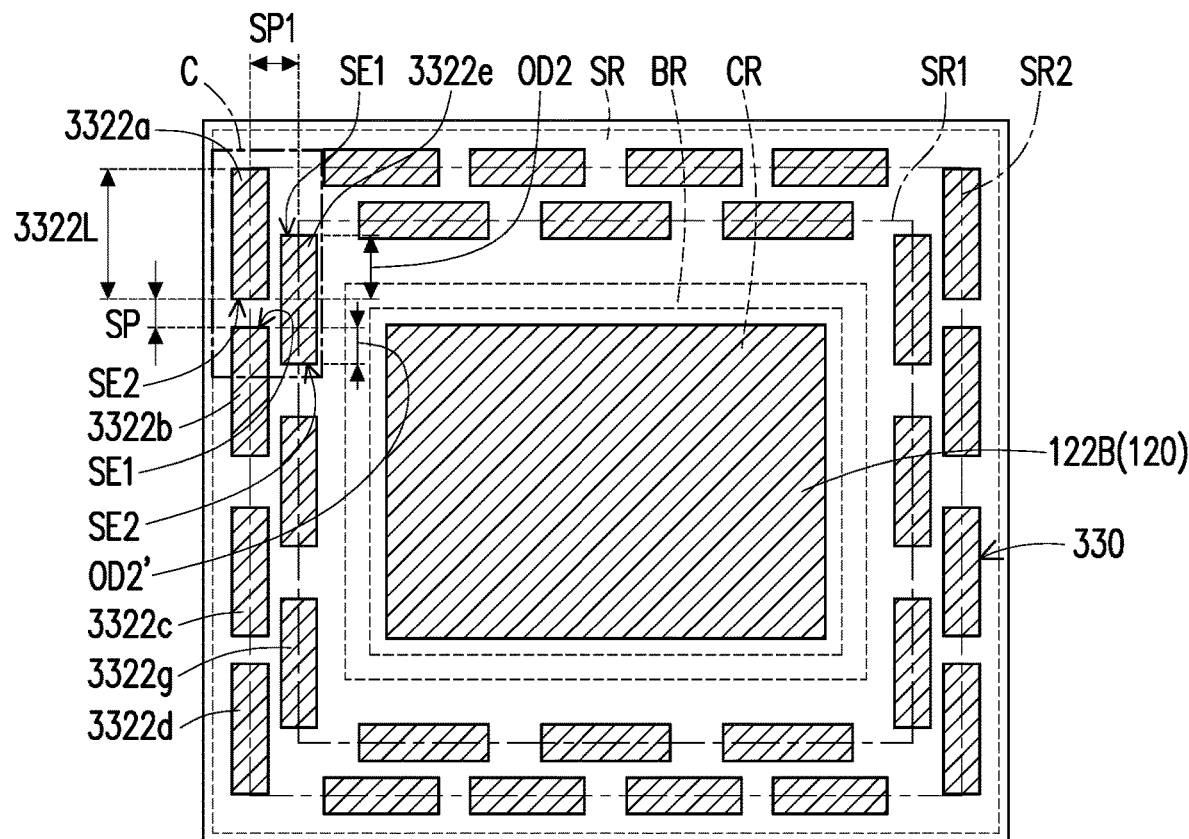
FIG. 5A is a schematic top view of a package component having a seal ring structure in accordance with some embodiments.
Figure 5B:
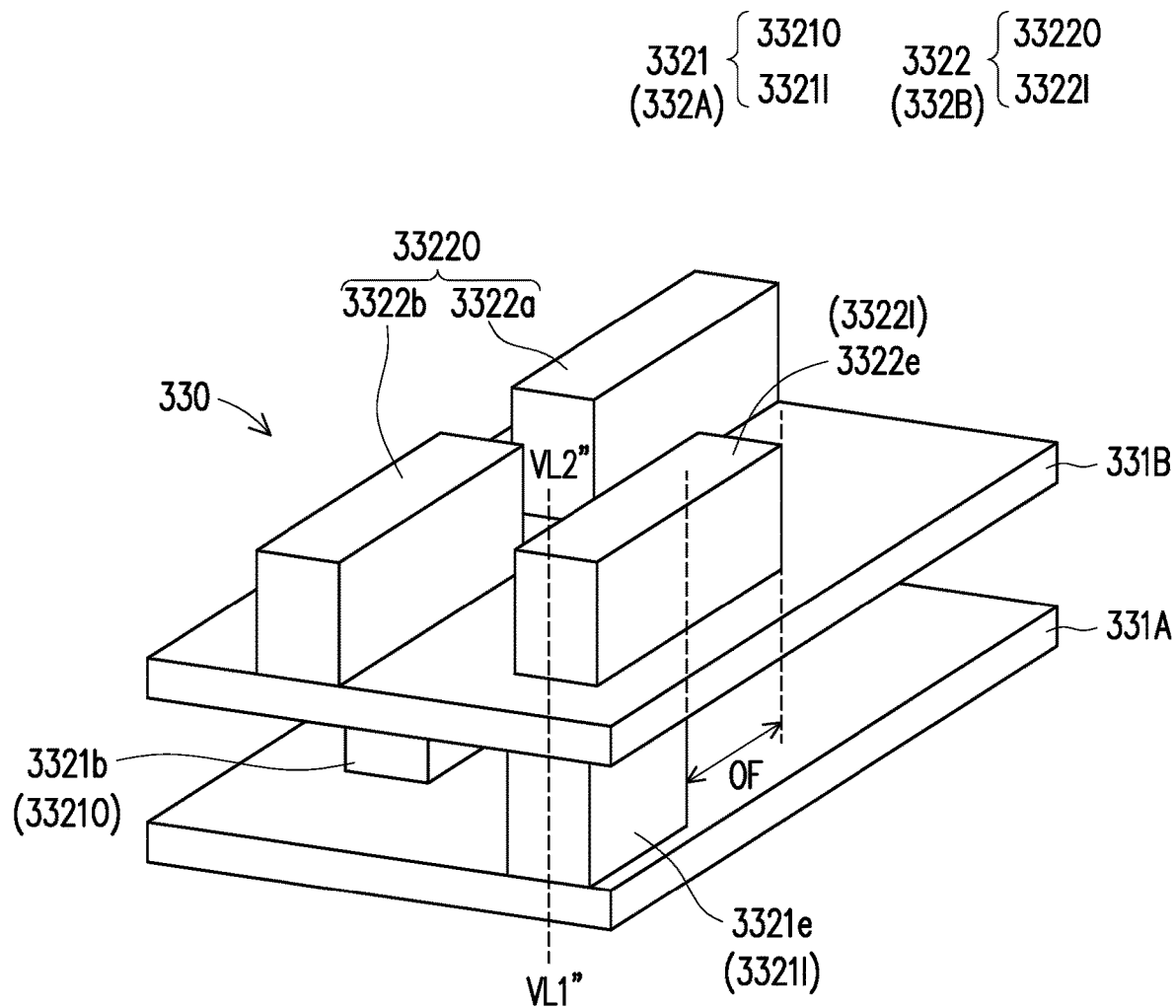
FIG. 5B is a schematic perspective view of a seal ring structure C shown in FIG. 5A in accordance with some embodiments.

FIG. 5A is a schematic top view of a package component having a seal ring structure in accordance with some embodiments, and FIG. 5B is a schematic perspective view of a seal ring structure C shown in FIG. 5A in accordance with some embodiments. Unless specified otherwise, the materials and the formation methods of the components are essentially the same as the like components, which are denoted by like reference numerals shown in FIGS. 1A-3. It is noted that the insulating layer covering the functional circuit structure and the seal ring structure is omitted for ease of illustration. It is also noted that two-layered seal ring structure is shown for illustrative only, and the seal ring structure is not limited to any specific number of layers in the disclosure.

Referring to FIGS. 5A-5B and also with reference to FIG. 4A, the difference between the structure shown in FIG. 5A and the structure shown in FIG. 4A lies in the arrangement of the seal ring structure 330. For example, the seal ring structure 330 located within the seal ring region SR at least includes the second interconnect layers (331A and 331B) and the second via patterns (332A and 332B). The second via pattern 332A may connect adjacent second interconnect layers (331A and 331B) and the second via pattern 332B is disposed on the second interconnect layer 331B. The second via pattern 332B may include a plurality of features 3322 arranged as parallel and non-continuous lines along the perimeter of the functional circuit region CR. The features 3322 may be spaced apart from one another.

For example, the second via pattern 332B includes a first portion 3322O of the features (e.g., 3322a, 3322b, 3322c, and 3322d) arranged along the outer path SR2 of the seal ring region SR, and a second portion 3322I of the features (e.g., 3322e, 3322f, and 3322g) arranged along the inner path SR1 of the seal ring region SR. The inner path SR1 of the seal ring region SR may be in proximity to the functional circuit region CR, and the outer path SR2 of the seal ring region SR may be away from the functional circuit region CR relative to the inner path SR1. In other words, the inner path SR1 is between the functional circuit region CR and the outer path SR2. The inner path SR1 and the outer path SR2 may follow the boundary of the functional circuit region CR. For example, the inner path SR1 and the outer path SR2 are substantially rectangular in shape although, in other embodiments, the inner path SR1 and the outer path SR2 may be irregular or may have a different shape in the top view.

For example, the second portion 3322I of the features 3322 may be arranged along the inner path SR1 to surround the four sides of the functional circuit region CR, and the first portion 3322O of the features 3322 may be arranged along the outer path SR2 to surround the second portion 3322I. In some embodiments, the first portion 3322O of the features (e.g., 3322a, 3322b, 3322c, and 3322d) is arranged end to end. For example, the feature 3322a has a rectangular shape along its length 3322L as well as a rectangular cross section. It is appreciated that other cross sectional profiles (e.g., trapezoid, inverted trapezoid, or the like) may be used. In some embodiments, the rest of the features 3322 are formed in the same (or similar) shapes and dimensions as the feature 3322a. It is noted that the features 3322 of the second via pattern 332B may take on any shape and be strategically placed within the seal ring region SR.

The adjacent features arranged along the outer path SR2 or the inner path SR1 may be spaced apart from one another with a gap SP1. The neighboring features arranged along the outer path SR2 may be spaced apart from each other with a substantially uniform gap SP1. In other embodiments, the features arranged along the outer path SR2 may be separated by different distances. Alternatively, one or more features arranged along the outer path SR2 may be spaced apart by the same distance, while others are separated by different distances. The various dimensions of the feature, such as the length, width, and distance of the gap, may include any suitable value. The features arranged along the inner path SR1 may have the same or similar arrangement as the features arranged along the outer path SR2. It is also noted that the number of the features 3322 disposed along the outer path SR2 and the inner path SR1 shown in FIG. 5A is for illustrative purposes only, other numbers and arrangements are possible.

The features arranged along the inner path SR1 and the features arranged along the outer path SR2 may be offset lengthwise relative to one another to overlap therewith along their length, and be spaced apart therefrom widthwise. For example, the second portion 3322I of the features 3322 arranged along the inner path SR1 and the first portion 3322O of the features 3322 arranged along the outer path SR2 are spaced apart transversely by a pitch SP. In some embodiments, each feature (e.g., 3322e, 3322f, and 3322g) arranged along the inner path SR1 may correspond to one of the gaps SP between the features (e.g., 3322a, 3322b, 3322c, and 3322d) arranged along the outer path SR2. The insulating layer (not shown) may be located in the gaps SP between the ends of the features 3322 along the outer path SR2 and the inner path SR1 to isolate the features 3322 from one another, and the insulating layer may also be located in the pitch SP1 between the inner path SR1 and the outer path SR2.

In some embodiments, the features (e.g., 3322e, 3322f, and 3322g) arranged along the inner path SR1 are longitudinally offset from the associated features (e.g., 3322a, 3322b, 3322c, and 3322d) arranged along the outer path SR2. For example, each feature 3322 includes a first end SE1 and a second end SE2 opposite to each other, and a longitudinal distance OD2 between the ends of the associated features (e.g., the second end SE2 of the feature 3322a and the first end SE1 of the feature 3322e) disposed in proximity to each other is non-zero. In some embodiments, a longitudinal distance OD2' between the ends of the associated features (e.g., the first end SE1 of the feature 3322b and the second end SE2 of the feature 3322e) in proximity to each other may also be non-zero. In some embodiments, the longitudinal distances OD2 and OD2' are substantially equal to each other. For example, the longitudinal distance (s) OD2 and/or OD2' is about 50 μm. Alternatively, the longitudinal distances OD2 and OD2' are different. It is noted that the longitudinal distances (0D2 and OD2') may be adjusted depending on the process and product requirements and construe no limitation in the disclosure.

Continue to FIG. 5B, the arrangement of the features 3322 at the second level may be the same or similar to the arrangement of the features 3321 at the first level. In some embodiments, for the first level, the first portion 3321O of the features (e.g., 3321b) is arranged along the outer path SR2 of the seal ring region SR, and the second portion 3321I of the features (e.g., 3321e) is arranged along the inner path SR1 of the seal ring region SR. The features 3322 of the second via pattern 332B disposed on the second interconnect layer 331B may be aligned with, or offset relative to, the features 3321 of the second via pattern 332A disposed on the second interconnect layer 331A. For example, the vertical centerline VL1" of the feature 3321e at the first level and the vertical centerline VL2" of the feature 3322e at the second level are substantially aligned. In some embodiments, the ends of the feature 3321e at the first level and the feature 3322e at the second level may be staggered by an offset OF in a cross-sectional view. The offset OF may be non-zero. Alternatively, the offset OF is zero. In other words, the position of the feature 3321e at the first level may be substantially the same as the position of the feature 3322e at the second level. In some other embodiments, the vertical centerline VL1" of the feature 3321e is offset from the vertical centerline VL2" of the feature 3322e, while the offset OF therebetween is non-zero. Alternatively, the vertical centerline VL1" of the feature 3321e and the vertical centerline VL2" of the feature 3322e are transversely offset, but the ends of the features (3321e and 3322e) are substantially aligned. The rest of the features 3321 at the first level and the rest of the features 3322 of the second level may have the same arrangement as the features (3321e and 3322e).

It is noted that different arrangements of the features at different levels may be used. In some embodiments, the second via pattern (332A or 332B) is replaced with the second via pattern described elsewhere herein, and variations thereof may be carried out while still remaining within the disclosure. It is noted that the arrangements shown in FIGS. 5A-5B are for illustrative purposes only, the second via patterns of the seal ring structure 330 may have different shapes in the top view, and may include more features or fewer features at different levels as long as voids induced during processing or testing can be released by the suitable arrangement of the seal ring structure 330.

Figure 6A:
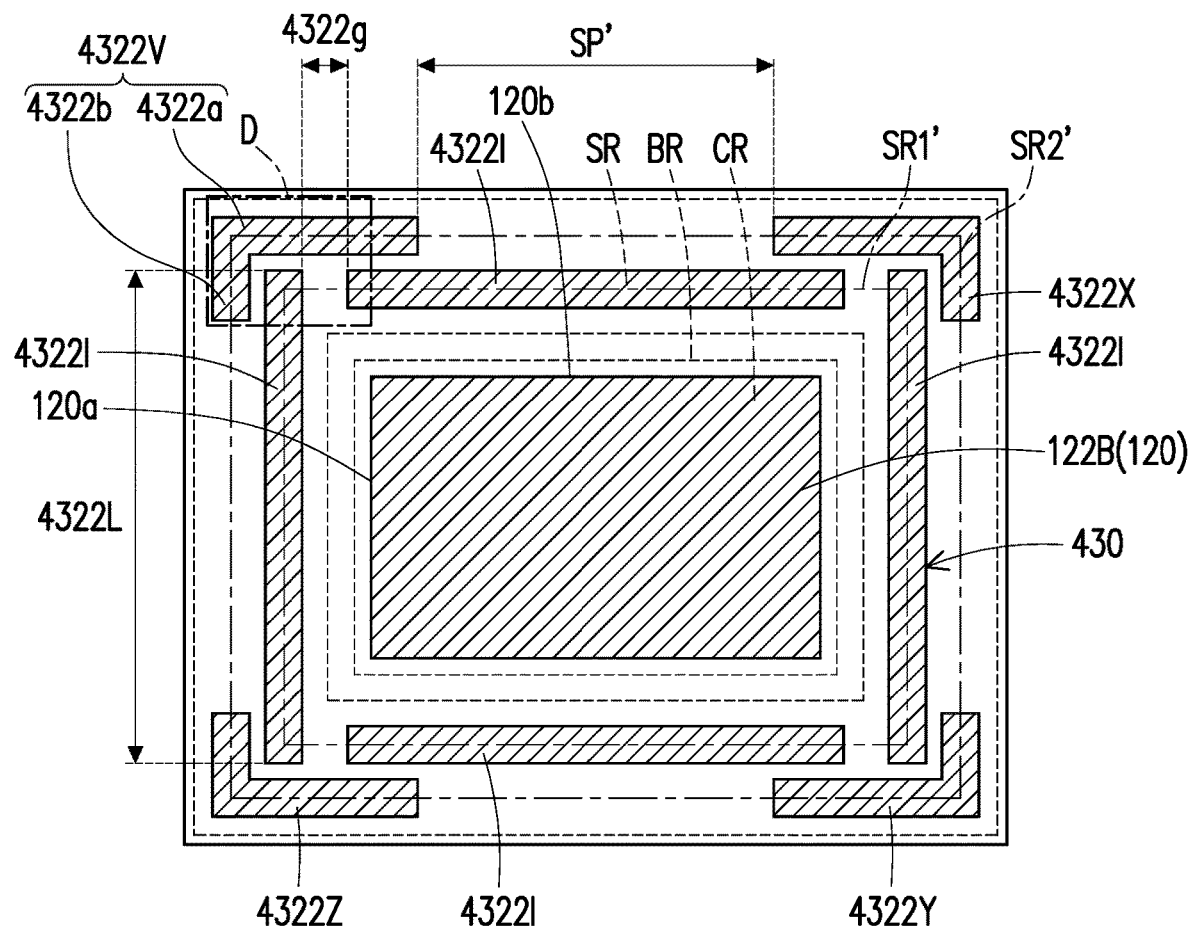
FIG. 6A is a schematic top view of a package component having a seal ring structure in accordance with some embodiments.
Figure 6B:
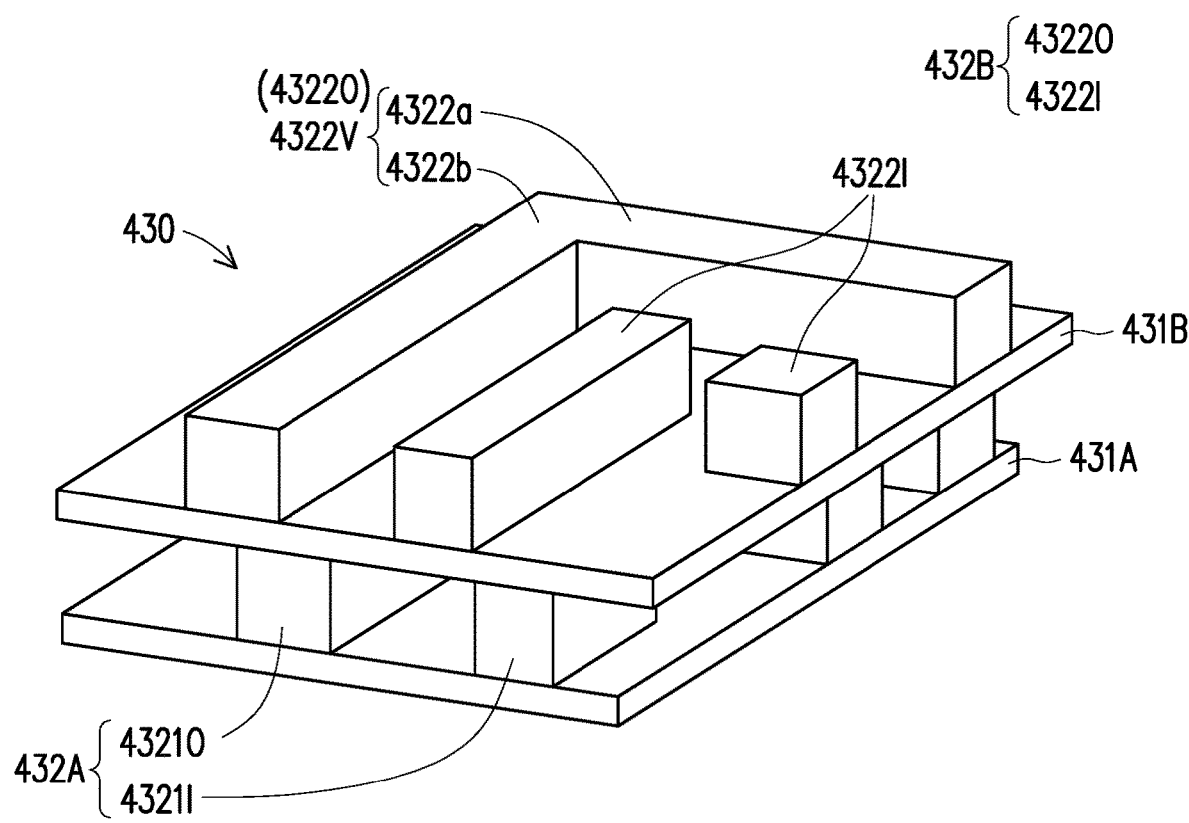
FIG. 6B is a schematic perspective view of a seal ring structure shown in FIG. 6A in accordance with some embodiments.

FIG. 6A is a schematic top view of a package component having a seal ring structure in accordance with some embodiments, and FIG. 6B is a schematic perspective view of a seal ring structure shown in FIG. 6A in accordance with some embodiments. Unless specified otherwise, the materials and the formation methods of the components are essentially the same as the like components, which are denoted by like reference numerals shown in FIGS. 1A-3. It is noted that the insulating layer covering the functional circuit structure and the seal ring structure is omitted for ease of illustration. It is also noted that two-layered seal ring structure is shown for illustrative only, and the seal ring structure is not limited to any specific number of layers in the disclosure.

Referring to FIGS. 6A-6B and also with reference to FIG. 4A, the difference between the structure shown in FIG. 6A and the structure shown in FIG. 5A lies in the arrangement of the seal ring structure 430. For example, the seal ring structure 430 located within the seal ring region SR at least includes the second interconnect layers (431A and 431B) and the second via patterns (432A and 432B). The second via pattern 432A may be connected to adjacent second interconnect layers (431A and 431B), and the second via pattern 432B is disposed on the second interconnect layer 431B. The second via pattern 432B may include a plurality of first features 4322I spaced apart from one another and arranged along the inner path SR1' of the seal ring region SR. The shape of the inner path SR1' may follow the sides (or perimeter) of the functional circuit region CR. In some embodiments, the second via pattern 432B includes a plurality of second features 4322O spaced apart from one another and arranged along the outer path SR2' of the seal ring region SR, where the outer path SR2' may surround the inner path SR1'. In some embodiments, the inner path SR1' and the outer path SR2' are substantially rectangular in shape although, in other embodiments, the inner path SR1 and the outer path SR2 may have different shapes in the top view.

In some embodiments, each of the first features 4322I has a rectangular shape along its length 4322L as well as a rectangular cross-sectional profile. In some embodiments, each of the first features 4322I is disposed parallel to one side of the functional circuit region CR in a non-continuous manner. For example, a gap 4322g is between two adjacent first features 4322I. The first features 4322I may have substantially the same dimensions. In some embodiments, the length 4322L of the respective first feature 4322I is greater than the length of the corresponding side of the functional circuit region CR. In some embodiments, the first features 4322I are of different dimensions. For example, some of the first features 4322I extend longer than the length of the corresponding side of the functional circuit region CR, while other first features 4322I are shorter than the corresponding side of the functional circuit region CR. Alternatively, the length 4322L of the respective first features 4322I is less than that of the corresponding side of the functional circuit region CR. In other embodiments, the first features 4322I are replaced with the second portion 3322I of the features shown in FIG. 5B. It is also noted that the number of the first features 4322I shown in FIG. 6A is for illustrative purposes only and construe no limitation in the disclosure.

In some embodiments, the second features 4322O are arranged corresponding to the gaps 4322g between the first features 4322I. For example, the respective second feature 4322O is offset lengthwise relative to the neighboring first features 4322I to overlap the gap 4322g between the neighboring first features 4322I. The respective second feature 4322O may be spaced apart from the neighboring first features 4322I in the direction of the width. For example, the second features 4322O are formed in an L-shape. The second features 4322O may be arranged at each corner of the seal ring region SR along the outer path SR2'. For example, each of the second features 4322O includes a first side 4322a and a second side 4322b connected to the first side 4322a. The first side 4322a may be longer than the second side 4322b. In such embodiments, the first side 4322a is referred to as the long side, and the second side 4322b is referred to as the short side. In other embodiments, the lengths of the first side 4322a and the second side 4322b is substantially equal to each other. In some embodiments, the first side 4322a of the respective second feature 4322O corresponds to the gap 4322g between the neighboring first features 4322I. The first features 4322I and the second features 4322O may include any suitable shape, such as a T-shape, a rectangular shape, a polygonal shape, a cross-shape, and/or combinations thereof, etc. It is appreciated that any suitable shapes and/or cross-sectional profiles of the first features 4322I and the second features 4322O may be used to achieve the same result.

The second features 4322O may be flipped vertically, flipped horizontally, rotated 90 degrees, or rotated 180 degrees relative to one another, in the top view. For example, the first side 4322a of the second feature 4322V is substantially parallel to the second side 120b of the function circuit region CR, and the second side 4322b of the second feature 4322V is substantially parallel to the first side 120a of the function circuit region CR. The second feature 4322X may be, relative to the second feature 4322V, flipped horizontally to be arranged at the corner of the seal ring region SR. The second feature 4322Y may be, relative to the second feature 4322X, flipped vertically to be arranged at the corner of the seal ring region SR. The second feature 4322Z may be, relative to the second feature 4322Y, flipped horizontally to be arranged at the corner of the seal ring region SR. In some embodiments, two neighboring second features 4322O are separated by a pitch SP', and the first feature 4322I is arranged corresponding to the pitch SP'. The pitch SP' between two neighboring second features 4322O may be less than the length 4322L of the corresponding first feature 4322I. For example, the first feature 4322I is offset lengthwise relative to the neighboring second features 4322O to overlap therewith along their length, and be spaced apart therefrom widthwise.

Continue to FIG. 6B, the arrangement of the second via pattern 432B at the second level may be the same or similar to the arrangement of the second via pattern 432A at the first level. In some embodiments, the second features 4321O are arranged along the outer path SR2" of the seal ring region SR, and the first features 4321I are arranged along the inner path SR1" of the seal ring region SR. The second via pattern 432B disposed on the second interconnect layer 431B may be aligned with, or offset relative to, the second via pattern 432A disposed on the second interconnect layer 431A. In some other embodiments, the second via pattern (432A or 432B) is replaced with the second via pattern described elsewhere herein, and variations thereof may be carried out while still remaining within the disclosure. It is noted that the arrangements shown in FIGS. 6A-6B are for illustrative purposes only, the second via patterns of the seal ring structure 430 may have different shapes in the top view, and other arrangements of the second via pattern at different levels are possible.

Figure 7A:
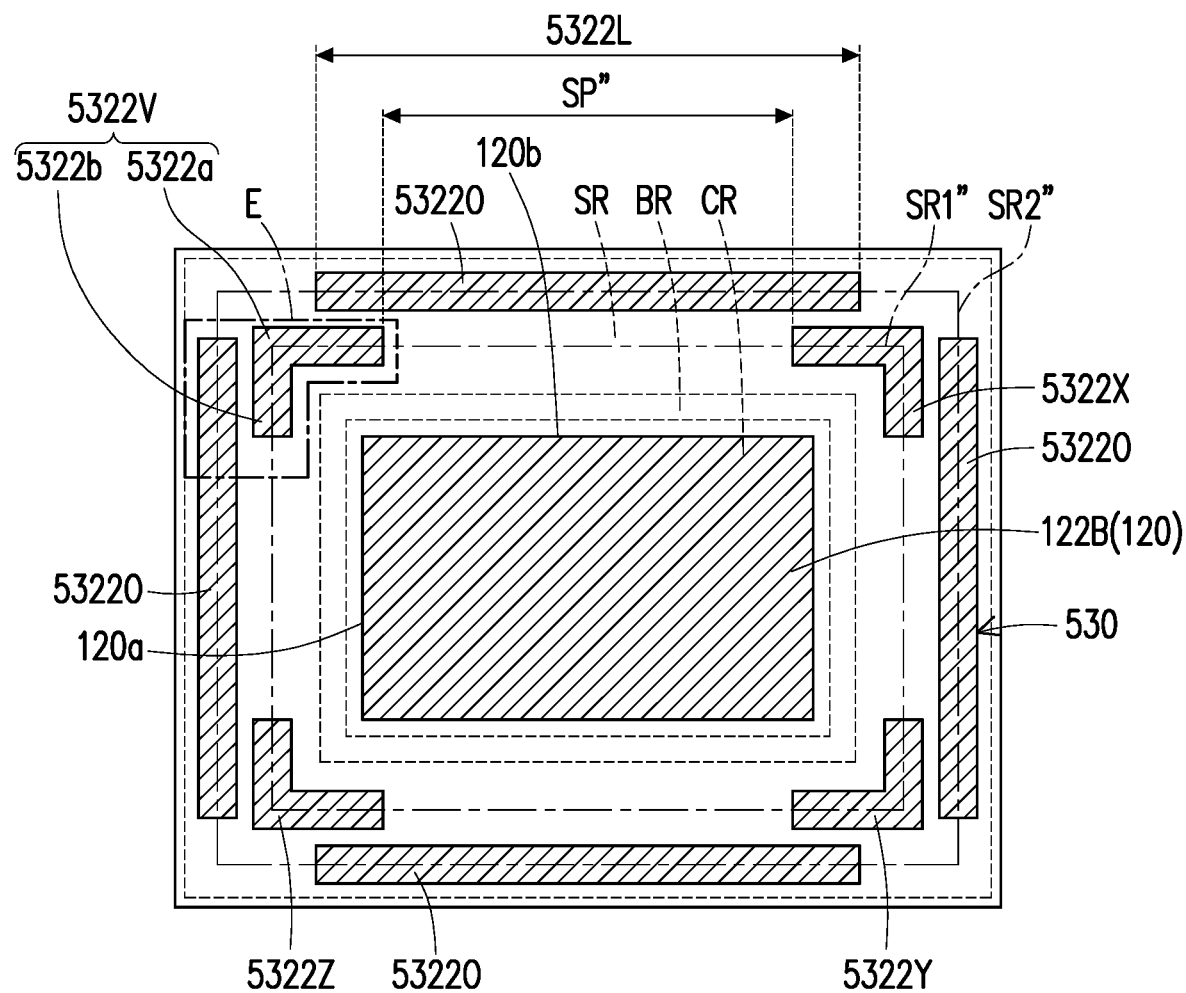
FIG. 7A is a schematic top view of a package component having a seal ring structure in accordance with some embodiments.
Figure 7B:
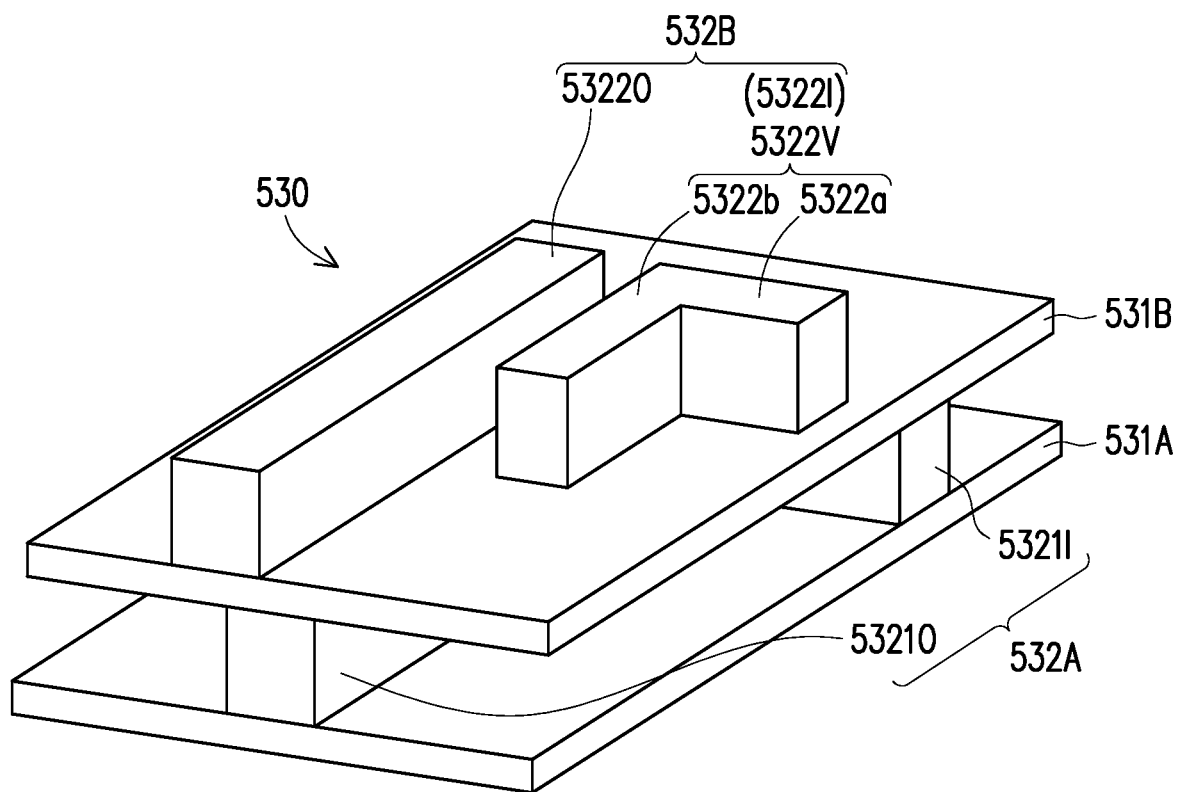
FIG. 7B is a schematic perspective view of a seal ring structure E shown in FIG. 7A in accordance with some embodiments.

FIG. 7A is a schematic top view of a package component having a seal ring structure in accordance with some embodiments, and FIG. 7B is a schematic perspective view of a seal ring structure E shown in FIG. 7A in accordance with some embodiments. Unless specified otherwise, the materials and the formation methods of the components are essentially the same as the like components, which are denoted by like reference numerals shown in FIGS. 1A-3. It is noted that the insulating layer covering the functional circuit structure and the seal ring structure is omitted for ease of illustration. It is also noted that two-layered seal ring structure is shown for illustrative only, and the seal ring structure is not limited to any specific number of layers in the disclosure.

Referring to FIGS. 7A-7B and also with reference to FIG. 6A, the difference between the structure shown in FIG. 7A and the structure shown in FIG. 6A lies in the arrangement of the seal ring structure 530. For example, the seal ring structure 530 located within the seal ring region SR at least include the second interconnect layers (531A and 531B) and the second via patterns (532A and 532B), where the second via pattern 532A connects adjacent second interconnect layers (531A and 531B) and the second via pattern 532B is disposed on the second interconnect layer 531B. The second via pattern 532B may include a plurality of first features 5322I spaced apart from one another and arranged along the inner path SR1" of the seal ring region SR. The shape of the inner path SR1" may follow the sides (or perimeter) of the functional circuit region CR. In some embodiments, the second via pattern 532B includes a plurality of second features 5322O spaced apart from one another and arranged along the outer path SR2" of the seal ring region SR, where the outer path SR2" surround the inner path SR1". In some embodiments, the inner path SR1" and the outer path SR2" are substantially rectangular in shape although, in other embodiments, the inner path SR1 and the outer path SR2 may have different shapes in the top view.

In some embodiments, each of the second features 5322O has a rectangular shape along its length 5322L as well as a rectangular cross-sectional profile. In some embodiments, each of the second features 5322O is disposed parallel to one side of the functional circuit region CR in a discrete manner. The second features 5322O arranged along the outer path SR2" may have substantially the same dimensions. In some embodiments, the second features 5322O are of different dimensions. The length 5322L of the respective second feature 5322O may be greater than the length of the corresponding side of the functional circuit region CR. Alternatively, the length 5322L of the respective second feature 5322O is less than the length of the corresponding side of the functional circuit region CR. In other embodiments, the second features 5322O are replaced with the second portion 3322I of the features 3322 shown in FIG. 5B. It is also noted that the number of the second features 5322O shown in FIG. 7A is for illustrative purposes only and construe no limitation in the disclosure.

In some embodiments, the first features 5322I are formed in an L-shape and arranged at each corner of the seal ring region SR along the inner path SR1". For example, each of the first features 5322I includes a first side and a second side connected to the first side. In some embodiments, the first side is longer than the second side. In some other embodiments, the lengths of the first side and the second side are substantially equal. The first features 5322I disposed along the inner path SR1" may be flipped vertically, flipped horizontally, rotated 90 degrees, or rotated 180 degrees, or combinations thereof, in the top view. For example, the first feature 5322V is disposed corresponding to one corner of the functional circuit region CR. The first feature 5322X arranged along the inner path SR1" may be, relative to the first feature 5322V, rotated 90 degrees in the clockwise direction, and may be disposed corresponding to another corner of the functional circuit region CR. In some embodiments, the first features (5322V and 5322X) may be spatially separated from each other by a pitch SP'". For example, one of the second features 5322O overlaps lengthwise relative to the pitch SP'" of the first features (5322V and 5322X) along their length, and the one of the second features 5322O is spaced apart from the first features (5322V and 5322X) in the direction of the width. The pitch SP'" may be non-zero. The length 5322L of the respective second feature 5322O may be greater than the pitch SP'" between the first features (5322V and 5322X). Alternatively, the length 5322L of the second feature 5322O may be substantially equal to the pitch SP'" between the first features (5322V and 5322X). It is appreciated that the pitch SP'" and the length 5322L may depend on the product and process requirements and are not limited to any specific value in the disclosure.

In some embodiments, the first features (5322Y and 5322Z) arranged along the inner path SR1" may be flipped vertically relative to the first features (5322V and 5322X), and may be disposed corresponding to the other two corners of the functional circuit region CR. In some embodiments, the first features (5322Y and 5322Z) may be separated from the first features (5322V and 5322X) by the pitch SP'". In some other embodiments, the first features (5322Y and 5322Z) and the first features (5322V and 5322X) may be spaced apart by different amounts of pitches which may depend on the area defined by the functional circuit region CR. Alternatively, the first features 5322I and the second features 5322O may include a rectangular shape, an L-shape, a T-shape, a polygonal shape, a cross-shape, combinations thereof, or any suitable shapes that may be used to achieve the same result.

Continue to FIG. 7B, the arrangement of the second via pattern 532B at the second level may be the same or similar to the arrangement of the second via pattern 532A at the first level. In some embodiments, the second features 5321O are arranged along the outer path SR2" of the seal ring region SR, and the first features 5321I are arranged along the inner path SR1" of the seal ring region SR. The second via pattern 532B disposed on the second interconnect layer 531B may be aligned with, or offset relative to, the second via pattern 532A disposed on the second interconnect layer 531A. In some other embodiments, the second via pattern (532A or 532B) is replaced with the second via pattern described elsewhere herein, and variations thereof may be carried out while still remaining within the disclosure. It is noted that the arrangements shown in FIGS. 7A-7B are for illustrative purposes only, the second via patterns of the seal ring structure 530 may have different shapes in the top view, and other arrangements of the second via pattern at different levels are possible.

The second via pattern of the seal ring structure described herein may take on any shape and be strategically placed within the seal ring region SR to effectively release voids induced during processing and/or reliability testing. By the configuration of the seal ring structure in the discontinuous manner, cracking at the corner of the package component can be reduced. Moreover, sine the seal ring structure is formed at the same time and by the same process as the functional circuit structure, the seal ring structure may be fabricated without affecting other processes required to manufacture the package component. The manufacturing time and cost may be easily controlled without requiring any additional expenses.

According to some embodiments, a package component for electrically coupling a semiconductor die is provided. The package component includes an insulating layer, a functional circuit structure, and a seal ring structure. The insulating layer includes a functional circuit region and a seal ring region surrounding the functional circuit region. The functional circuit structure is embedded in the insulating layer within the functional circuit region, where the semiconductor die disposed on the package component is electrically coupled to the functional circuit structure. The seal ring structure is embedded in the insulating layer within the seal ring region and electrically isolated from the functional circuit structure. The seal ring structure includes a stack of alternating interconnect layers and via patterns, and the via pattern at each level of the stack includes first features spaced apart from one another and arranged at neighboring corners of the seal ring region.

According to some alternative embodiments, a semiconductor package includes a package component and a semiconductor die. The package component includes a functional circuit structure and a seal ring structure surrounding the functional circuit structure, the seal ring structure is electrically floating in the package component, the seal ring structure includes an interconnect layer and a via pattern disposed on the interconnect layer, and the via pattern includes a plurality of first features arranged in a discrete manner along a perimeter of the functional circuit structure. The semiconductor die is disposed on the package component and electrically coupled to the functional circuit structure of the package component.

According to some alternative embodiments, a manufacturing method of a semiconductor package includes at least the following steps. A package component is formed by at least the following steps. A first via pattern is formed on a first interconnect layer within a functional circuit region and a second via pattern is formed on a second interconnect layer within a seal ring region, where the functional circuit region is encircled by the seal ring region, and the second via pattern includes a plurality of features isolated from one another. An insulating layer is laminated to cover the first via pattern, the first interconnect layer, the second via pattern, and the second interconnect layer, where the first via pattern and the first interconnect layer are isolated from the second via pattern and the second interconnect layer by the insulating layer. A first semiconductor die is coupled to the package component.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package component for electrically coupling a semiconductor die, the package component comprising:
    a functional circuit structure embedded in an insulating layer, wherein the semiconductor die disposed on the package component is electrically coupled to the functional circuit structure; and
    a seal ring structure embedded in the insulating layer and electrically isolated from the functional circuit structure, the seal ring structure comprising a stack of alternating interconnect layers and via patterns, the via pattern at each level of the stack comprising first features spaced apart from one another and arranged at neighboring corners of the insulating layer, and the first features being offset lengthwise relative to each other to overlap therewith, and the first features are spaced apart widthwise relative to each other.

2. The package component of claim 1, wherein in a cross-sectional view, a vertical centerline of the via pattern at one level of the stack is transversely offset from a vertical centerline of the via pattern at adjacent one level of the stack.

3. The package component of claim 1, wherein the first features of the via pattern at one level of the stack are in an L-shape and located at each of the corners of the insulating layer.

4. The package component of claim 1, wherein the insulating layer comprises:
    a functional circuit region in which the functional circuit structure is embedded;
    a seal ring region in which the seal ring structure is embedded; and
    a buffer region encircling the functional circuit region and interposed between the functional circuit region and the seal ring region.

5. The package component of claim 1, wherein the via pattern at one level of the stack comprises:
    the first features arranged along a first path surrounding the functional circuit structure; and
    a plurality of second features separately arranged along a second path surrounding the first path, wherein the first features are isolated from the second features by the insulating layer.

6. The package component of claim 5, wherein adjacent two of the first features are separated by a pitch, and one of the second features overlaps lengthwise the pitch of the adjacent two of the first features and is separated widthwise from the adjacent two of the first features.

7. The package component of claim 1, wherein the insulating layer comprises a plurality of lamination films stacked upon one another, and each of the lamination films covers one of the interconnect layers and one of the via patterns disposed on the one of the interconnect layers.

8. The package component of claim 7, wherein a top surface of one of the lamination films is substantially leveled with a top surface of one of the via patterns covered by the one of the lamination films.

9. A semiconductor package, comprising:
    a package component comprising a functional circuit structure and a seal ring structure in proximity to the functional circuit structure, the seal ring structure being electrically floating in the package component, a via pattern of the seal ring structure comprising:
        first features and second features, wherein adjacent two of the first features are separated by a pitch, and one of the second features overlaps lengthwise the pitch and is separated widthwise from the adjacent two of the first features; and
    a semiconductor die disposed on the package component and electrically coupled to the functional circuit structure of the package component.

10. The semiconductor package of claim 9, wherein the first features of the seal ring structure are disposed at corners of the package component.

11. The semiconductor package of claim 9, wherein the seal ring structure further comprises an interconnect layer on which the via pattern is disposed, and interconnect layer and the via pattern are isolated from the functional circuit structure.

12. The semiconductor package of claim 9, wherein the second features of the seal ring structure are disposed at corners of the package component and separately from one another by a pitch, wherein the pitch of adjacent two of the second features is less than a length of one of the first features corresponding to the adjacent two of the second features.

13. The semiconductor package of claim 9, wherein the package component further comprises:
    a lamination layer isolating the seal ring structure from the functional circuit structure, wherein the seal ring structure and the functional circuit structure are embedded in the lamination layer.

14. A method, comprising:
    forming a package component comprising:
        forming a first via pattern and a second via pattern respectively on a first interconnect layer and a second interconnect layer, wherein the second via pattern comprises a plurality of first features offset lengthwise relative to each other to overlap therewith, and the first features are spaced apart widthwise relative to each other; and forming an insulating layer to cover the first via pattern, the first interconnect layer, the second via pattern, and the second interconnect layer, wherein the first via pattern and the first interconnect layer are isolated from the second via pattern and the second interconnect layer by the insulating layer.

15. The manufacturing method of claim 14, further comprising:

coupling a semiconductor die to the package component; and forming a molding layer on the package component to cover the semiconductor die.

16. The manufacturing method of claim 15, wherein forming the molding layer comprises:

forming a release film on the semiconductor die to cover contact pads of the semiconductor die; and dispensing a molding material to a gap between the release film and the package component to cover the semiconductor die.

17. The manufacturing method of claim 16, wherein:

coupling the semiconductor die comprises mounting conductive terminals of the semiconductor die on the package component, and removing the release film after forming the molding layer, and then forming external connectors on the contact pads of the semiconductor die, wherein the external connectors and the conductive terminals are formed at two opposing sides of the semiconductor die.

18. The manufacturing method of claim 14, wherein forming the package component further comprises:

forming the first interconnect layer and the second interconnect layer on a dielectric material layer before forming the first via pattern and the second via pattern; and removing a portion of the dielectric material layer to form a dielectric layer with openings accessibly exposing at least a portion of the first interconnect layer.

19. The manufacturing method of claim 18, wherein forming the second via pattern further comprises:

forming a plurality of second features separately from one another by a pitch, wherein the pitch of adjacent two of the second features is less than a length of one of the first features corresponding to the adjacent two of the second features.

20. The manufacturing method of claim 14, wherein forming the package component further comprises:

forming the first interconnect layer and the second interconnect layer on a first dielectric material layer before forming the first via pattern and the second via pattern; and forming a second dielectric material layer over the insulating layer.

\* \* \* \* \*